United States Patent
Walke et al.

(10) Patent No.: US 9,419,114 B2
(45) Date of Patent: Aug. 16, 2016

(54) TUNNEL FIELD-EFFECT TRANSISTOR

(71) Applicants: IMEC VZW, Leuven (BE); Taiwan Semiconductor Manufacturing Company, Ltd., HsinChu (TW)

(72) Inventors: Amey Mahadev Walke, Mumbai (IN); Anne VanDooren, Mazy (BE); Krishna Kumar Bhuwalka, HsinChu (TW)

(73) Assignees: IMEC VZW, Leuven (BE); Taiwan Semiconductor Manufacturing Company, Ltd., HsinChu (TW)

( * ) Notice: Subject to any disclaimer, the term of this patent is extended or adjusted under 35 U.S.C. 154(b) by 0 days.

(21) Appl. No.: 14/599,354

(22) Filed: Jan. 16, 2015

(65) Prior Publication Data
US 2015/0206958 A1 Jul. 23, 2015

(30) Foreign Application Priority Data
Jan. 17, 2014 (EP) .................................... 14151519

(51) Int. Cl.
*H01L 29/66* (2006.01)
*H01L 29/78* (2006.01)
(Continued)

(52) U.S. Cl.
CPC .... *H01L 29/66977* (2013.01); *H01L 21/28017* (2013.01); *H01L 21/30604* (2013.01); *H01L 21/31111* (2013.01); *H01L 21/31144* (2013.01); *H01L 29/0847* (2013.01); *H01L 29/1037* (2013.01); *H01L 29/66356* (2013.01); *H01L 29/66477* (2013.01); *H01L 29/7391* (2013.01); *H01L 29/78* (2013.01)

(58) Field of Classification Search
CPC ...................... H01L 29/7391; H01L 29/66356; H01L 29/66977; H01L 29/7827; H01L 29/78; H01L 29/0657
See application file for complete search history.

(56) References Cited

U.S. PATENT DOCUMENTS 8,258,031 B2  9/2012  Lauer et al.
8,362,561 B2  1/2013  Nuttinck et al.
(Continued)

FOREIGN PATENT DOCUMENTS

JP        2015050196 A  *  3/2015 ............ H01L 21/336
WO    WO 2012/152762       11/2012

OTHER PUBLICATIONS

VanDooren et al., "Analysis of trap-assisted tunneling in vertical Si homo-junction and SiGe hetero-junction Tunnel-FETs", Solid-State Electronics 83 (2013) 50-55.

*Primary Examiner* — Cuong Q Nguyen
*Assistant Examiner* — Nishath Yasmeen
(74) *Attorney, Agent, or Firm* — Knobbe Martens Olson & Bear, LLP

(57) ABSTRACT

A tunnel field-effect transistor (TFET) device is provided comprising a semiconductor substrate and a fin structure disposed thereon. The fin structure comprises a channel region and a source region disposed on the channel region. The TFET further comprises a drain region contacting the channel region, wherein the source region and the drain region are of opposite conductivity type. The TFET also comprises a pocket layer covering a gate interface portion of the source region and contacting at least part of the channel region. The TFET further comprises a gate dielectric layer covering the pocket layer and a gate electrode covering the gate dielectric layer. The gate interface portion of the source region comprises at least three mutually non-coplanar surface segments. A method for manufacturing such a TFET device is also provided.

18 Claims, 30 Drawing Sheets

(51) Int. Cl.
*H01L 29/10* (2006.01)
*H01L 29/08* (2006.01)
*H01L 21/306* (2006.01)
*H01L 21/311* (2006.01)
*H01L 21/28* (2006.01)
*H01L 29/739* (2006.01)

(56) References Cited

U.S. PATENT DOCUMENTS

| | | | |
|---|---|---|---|
| 8,415,209 | B2 | 4/2013 | Rooyackers et al. |
| 2012/0032227 | A1 | 2/2012 | Seabaugh et al. |
| 2013/0093497 | A1 | 4/2013 | Lee et al. |

\* cited by examiner

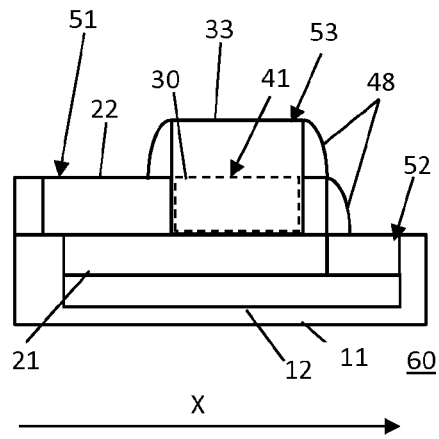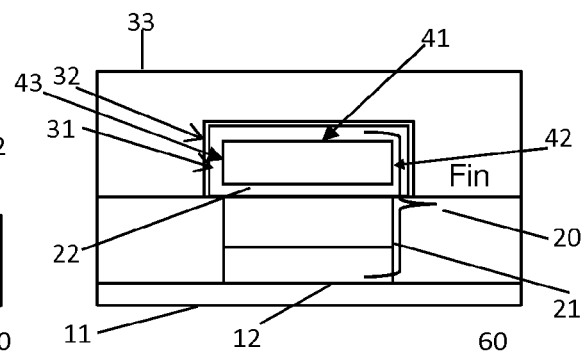
FIG. 5　　　　　FIG. 6
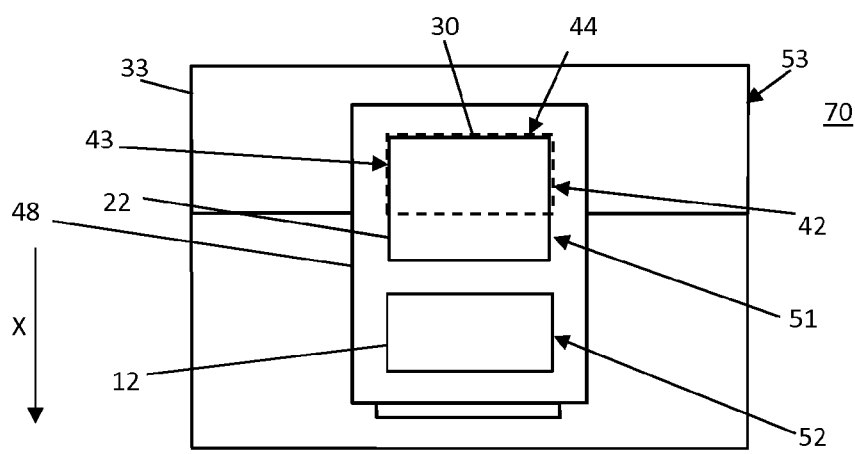
FIG. 7
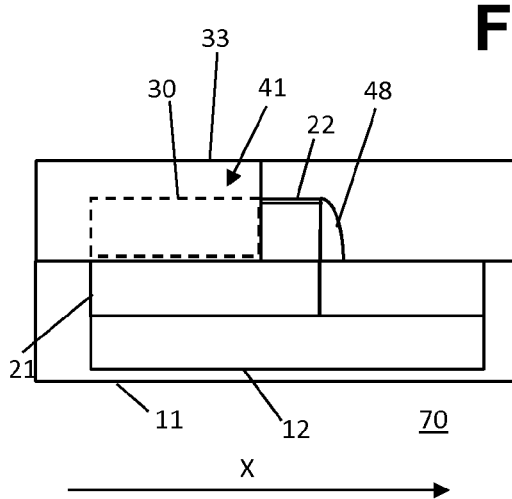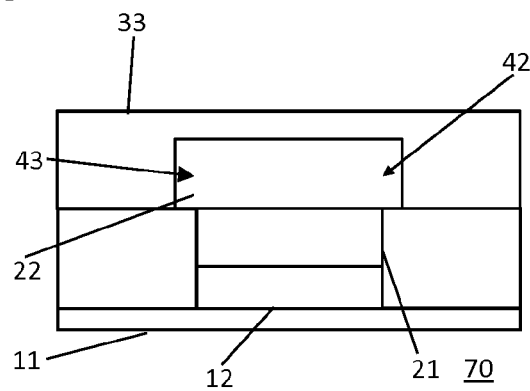
FIG. 8　　　　　FIG. 9

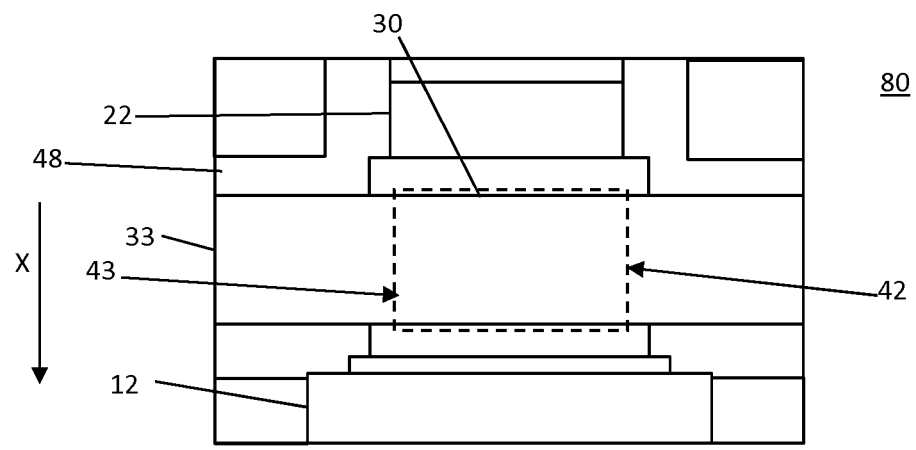
FIG. 10
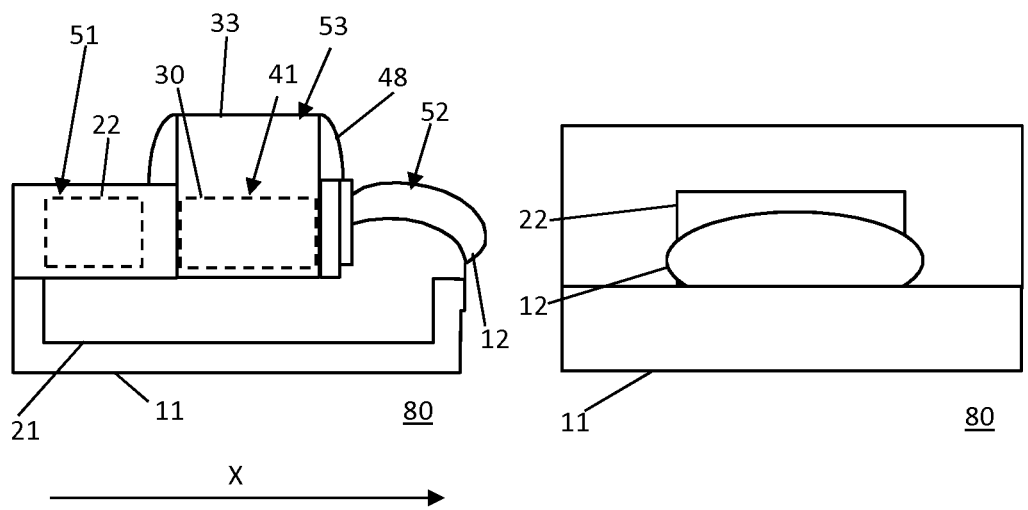
FIG. 11  FIG. 12

TUNNEL FIELD-EFFECT TRANSISTOR

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Application No. EP 14151519.7, filed Jan. 17, 2014. The aforementioned application is incorporated by reference herein in its entirety, and is hereby expressly made a part of this specification.

FIELD OF THE INVENTION

Semiconductor integrated circuit components are provided, for example, a tunnel field-effect transistor device and a method for manufacturing such a device.

BACKGROUND OF THE INVENTION

Where quantum tunneling imposes limitations on the achievable size, speed and current of conventional metal-oxide semiconductor field-effect transistors (MOSFET), this phenomenon can be turned to an advantage in the more recently introduced tunnel FET (TFET). In such TFET, the device switches state by altering the probability of charge tunneling through a high energy barrier, as opposed to the raising or lowering of the energy barrier as is known in MOSFETs.

In a TFET, semiconducting material is arranged in p-i-n or n-i-p configuration, e.g. a sequence of a positively doped, intrinsic and negatively doped regions. The intrinsic channel may have substantially equal amounts of free electrons and holes, which corresponds to a maximum of resistivity of the semiconductor material, and thus provides a thick energy barrier. In general, the intrinsic channel may not be exactly charge carrier neutral, and may even be lightly doped, but the intrinsic channel typically has a dopant concentration substantially smaller than the positively and negatively doped regions, e.g. at least one order of magnitude smaller, such that a sufficient energy barrier between the p+ and n+ regions is imposed. By applying a voltage to the transistor gate, an overlap between the conduction band in the source and the valence band in the channel is created or enlarged, such that a tunneling window is opened. Unlike what happens in a MOSFET, in a TFET the charges move between conduction and valence bands. Creating the overlap in bands typically requires much smaller voltages than in a MOSFET.

FinFET devices were proposed as a solution to short channel effects which were major road blocks for scaling of the CMOS technology. Being three-dimensional devices, they offer additional benefit in terms of higher current in small device volume. This allows high density packing of integrated circuits. Nevertheless, FinFETs being a 3D variant of a 2D MOSFET, their sub-threshold swing is limited, e.g. to 60 mV/decade, which may form a road block for scaling of the power supply. Tunnel Field Effect transistors are an attractive solution to this problem due to their promise to offer sub-threshold swings below 60 mV/decade at room temperature.

It has been shown in literature that tunneling efficiency of TFETs can be improved by aligning tunneling direction to the gate electric field. This class of TFETs may be referred to as line-TFETs or area tunneling devices, as the current may be substantially proportional to the area of the gate or to the area of the gate overlap on the source.

A three-dimensional TFET device comprising a fin-like structure was disclosed in WO 2012/152762. The fin-like structure in a TFET device according to WO 2012/152762 may either form a source region or alternatively a channel region. A large tunneling area for band-to-band tunneling is achieved by placing the gate structure on one side and the source region on the other, preferably opposing, side of the thin fin such that a large area is available for band-to-band tunneling which strongly increases the ON-current of the device. According to WO 2012/152762, the source region may be formed to one side of the fin-like structure and the drain region may be on the other side, taken along the longitudinal direction, of the fin-like structure.

SUMMARY OF THE INVENTION

It is an object of the embodiments to provide a good and efficient tunnel field-effect transistor, and to provide a good and efficient method for manufacturing such a tunnel field-effect transistor. The above objective is accomplished by a method and device according to the embodiments.

It is an advantage of embodiments that Tunnel Field-Effect Transistor (TFET) structures are provided which can have a low sub-threshold swing (SS), e.g. an SS at room temperature of 60 mV/decade or lower.

It is an advantage of embodiments that Tunnel Field-Effect Transistor (TFET) structures are provided which enable tunneling of charge carriers in a tunneling direction substantially aligned to the gate electric field. For example, for each point from which a non-negligible amount of carriers are able to tunnel through the potential barrier imposed by an intrinsic channel region of the TFET when the transistor gate is in an ON state, the spatial distribution of the direction of tunneling of the carriers originating from this point, or from a source volume centered around this point, has a local or global maximum in a direction which deviates less than 10 degrees, e.g. less than 5 degrees or even 1 degree or less, from the direction toward which the electric field vector points in that point.

It is an advantage of embodiments that a high current per footprint area can be achieved in a TFET. It is an advantage of embodiments that a low intrinsic delay can be achieved in a TFET.

In a first aspect, a tunnel field-effect transistor device is provided comprising a semiconductor substrate and a fin structure disposed on said semiconductor substrate. This fin structure comprises a channel region and a source region disposed on the channel region. The tunnel field-effect transistor further comprises a drain region contacting the channel region, wherein the source region and the drain region are of opposite conductivity type. The tunnel field-effect transistor also comprises a pocket layer covering a gate interface portion of the source region and contacting at least part of the channel region. The tunnel field-effect transistor further comprises a gate dielectric layer covering the pocket layer and a gate electrode covering the gate dielectric layer. The gate interface portion of the source region comprises at least three mutually non-coplanar surface segments.

In some embodiments, each of the at least three mutually non-coplanar surface segments may be oriented orthogonal or parallel to a surface of the semiconductor substrate on which the fin structure is disposed.

In some embodiments, the fin structure may comprise said drain region, and the channel region may be disposed on the drain region.

In some embodiments, the gate interface portion may comprise an end portion of the source region with respect to a longitudinal direction along which the fin structure extends over the semiconductor substrate.

A tunnel field-effect transistor device according to some embodiments may furthermore comprise a source contact for providing an electrical interface to the source region, a drain contact for providing an electrical interface to the drain region and a gate contact for providing an electrical interface to the gate electrode, wherein the source contact may be disposed between the drain contact and the gate contact along said longitudinal direction.

A tunnel field-effect transistor device according to some embodiments may furthermore comprise a source contact for providing an electrical interface to the source region, wherein the source contact may be at least partially surrounded by the gate electrode.

In some embodiments, the gate interface portion may be spaced away from the end portions of the source region with respect to a longitudinal direction along which the fin structure extends over the semiconductor substrate. For example, in some embodiments, the gate interface portion may comprise a central portion of the source region with respect to a longitudinal direction along which the fin structure extends over the semiconductor substrate, such that the gate interface portion does not comprise an end portion of the source region with respect to said longitudinal direction.

A tunnel field-effect transistor device according to some embodiments may furthermore comprise a source contact for providing an electrical interface to the source region, a drain contact for providing an electrical interface to the drain region and a gate contact for providing an electrical interface to the gate electrode, wherein the gate contact may be disposed between the source contact and the drain contact along the longitudinal direction.

In a second aspect, a method is provided for manufacturing a tunnel field-effect transistor device. Such method comprises providing a fin structure on a semiconductor substrate, said fin structure comprising a channel region and a source region disposed on said channel region. Providing a fin structure may for instance comprise: first, growing a stack on a semiconductor substrate, said stack comprising a channel region and a source region disposed on said channel region, and second, etching the stack to form a fin structure on the semiconductor substrate.

Furthermore, the method comprises providing a gate structure on the fin structure, the gate structure comprising a pocket layer covering a gate interface portion of the source region and contacting at least part of the channel region, a gate dielectric layer disposed on said pocket layer and a gate electrode disposed on said gate dielectric layer. The method further comprises providing a drain region of opposite conductivity type with respect to the source region, said drain region being disposed such as to contact the channel region. The gate interface portion furthermore comprises at least three mutually non-coplanar surface segments.

In a method according to some embodiments, growing the stack on the semiconductor substrate may comprise growing the drain region on the semiconductor substrate, growing the channel region on the drain region and growing the source region on the channel region.

A method according to some embodiments may furthermore comprise locally etching away the source region and the channel region to expose a drain contact for providing an electrical interface to the drain region.

In a method according to some embodiments, providing the gate structure may comprise protecting the semiconductor substrate and a lower portion of the fin with an isolation mask such that the source region and a portion of the channel region remain exposed, growing the pocket layer on the source region and on said portion of the channel region, depositing the gate dielectric layer on the pocket layer, depositing the gate electrode on the gate dielectric layer, patterning the gate electrode such as to remove the gate electrode material overlaying the source region outside said gate interface portion, and etching away the gate dielectric layer and the pocket layer using said gate electrode as mask.

In a method according to some embodiments, providing the gate structure may furthermore comprise isotropic etching of the source region before growing the pocket layer in order to align the pocket layer with the channel region.

In a method according to some embodiments, growing said stack on the semiconductor substrate may furthermore comprise providing a hard mask layer over the source region, polishing the fin structure to expose the hard mask layer after depositing the gate electrode and removing the hard mask layer to expose a source contact for providing an electrical interface to the source region, such that the source contact is at least partially surrounded by the gate electrode.

In a method according to some embodiments, providing of the gate structure may be adapted such that said gate interface portion of the source region is spaced away from the end portions of the source region with respect a longitudinal direction along which the fin structure extends over the semiconductor substrate. For example, in a method according to some embodiments, providing of the gate structure may be adapted such that said gate interface portion of the source region comprises a central portion of the source region with respect to a longitudinal direction along which the fin structure extends over the semiconductor substrate, and in which the gate interface portion does not comprise an end portion of the source region with respect to said longitudinal direction.

In a method according to some embodiments, providing of the gate structure may be adapted such that said gate interface portion of the source region comprises an end portion of the source region with respect to a longitudinal direction along which the fin structure extends over the semiconductor substrate.

Particular and preferred aspects of the invention are set out in the accompanying independent and dependent claims. Features from the dependent claims may be combined with features of the independent claims and with features of other dependent claims as appropriate and not merely as explicitly set out in the claims. These and other aspects of the invention will be apparent from and elucidated with reference to the embodiment(s) described hereinafter.

BRIEF DESCRIPTION OF THE DRAWINGS

FIG. 5 shows a side view of a TFET device according to a second embodiment.

FIG. 6 shows a front view of a TFET device according to a second embodiment.

FIG. 7 shows a top view of a TFET device according to a third embodiment.

FIG. 8 shows a side view of a TFET device according to a third embodiment.

FIG. 9 shows a front view of a TFET device according to a third embodiment.

FIG. 10 shows a top view of a TFET device according to a fourth embodiment.

FIG. 11 shows a side view of a TFET device according to a fourth embodiment.

FIG. 12 shows a front view of a TFET device according to a fourth embodiment.

Figure 1:
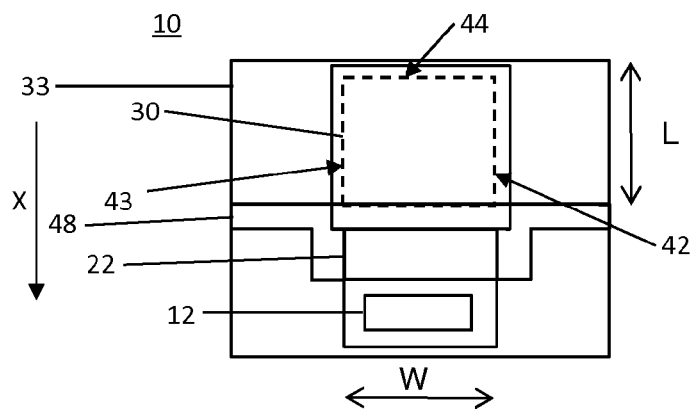
FIG. 1 shows a top view of a tunnel field-effect transistor (TFET) device according to a first embodiment.

The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this invention, in one or more embodiments.

Similarly it should be appreciated that in the description of exemplary embodiments of the invention, various features of the invention are sometimes grouped together in a single embodiment, figure, or description thereof for the purpose of streamlining the invention and aiding in the understanding of one or more of the various inventive aspects. This method of invention, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Embodiments may relate to Fin-based Tunnel Field-Effect Transistor (TFET) structures and to methods of fabrication for such devices. Process flows for manufacturing processes according to some embodiments are also described hereinbelow.

A Tunnel Field-effect Transistor (TFET) device according to some embodiments may advantageously provide a tunneling direction substantially aligned to the gate electric field. Thus, TFET structures may be provided which enable tunneling of charge carriers in a tunneling direction substantially aligned to the gate electric field. For example, for each point $\vec{p}$ from which a non-negligible amount of carriers are able to tunnel through the potential barrier imposed by an intrinsic channel region of the TFET when the transistor gate is in an ON state, the spatial distribution of the direction of tunneling of the carriers originating from this point $\vec{p}$, or from a source volume $V \subseteq B(\vec{p},r) = \{\vec{x} : \|\vec{x} - \vec{p}\| \leq r\}$ centered around this point, has a local or global maximum in a direction which deviates less than 10 degrees, e.g. less than 5 degrees or even 1 degree or less, from the direction toward which the electric field vector $\vec{E}_{gate}(\vec{p})$ points in that point p. Here, B(p,r) denotes a ball enclosing the volume V, in which this ball comprises the spatial points x having an Euclidean distance to the point p which is less than or equal to a radius r, in which the radius r may typically be smaller than the dimensions of the TFET device, e.g. at least ten times smaller than the largest diameter of the TFET structure, or even at least hundred times smaller than the largest diameter of the TFET device.

It is an advantage of embodiments that a high current per footprint area can be achieved. Since the tunneling current may be proportional to the area of the gate, the intrinsic delay of the device may remain substantially constant with increase in gate length or width. Thus, having longer gate length does not degrade the intrinsic delay of these devices. Therefore the device can be useful in the applications where extrinsic delay is higher than the intrinsic delay. Here extrinsic delay could be property of circuits and may for example arise due to higher load capacitance, or interconnect resistance/capacitance, e.g. in memory circuits long bit and word lines may be driven by a driver transistor.

Embodiments may disclose a tunnel field effect transistor (TFET) with an improved architecture in order to increase the tunneling, e.g. making the Band-To-Band (BTB) tunneling at the source more effective.

Efficient tunneling may be achieved in embodiments by providing the gate structure over the source region such that the gate electrode is substantially parallel to at least three non-coplanar surface segments, e.g. surface facets or planes of the source region. Furthermore, the gate electrode is electrically isolated from the source region by a gate dielectric, and between the gate dielectric and the source region a pocket layer is provided which contacts a channel region, e.g. an intrinsic or undoped semiconductor region, underneath the source region. The pocket region, which may be doped with the species opposite the conductivity type of the source region, thus may capture charge carriers tunneling from the source in the direction of the gate electrode, e.g. in a direction substantially parallel to the gate electric field, and divert such charges via the channel region to a drain region which is in contact with the channel region, but electrically insulated from the source region. Thus, a large tunneling area can be achieved, and therefore also a large tunneling current. Furthermore, traverse tunneling, or point tunneling, may be avoided or reduced by some embodiments.

In a first aspect, a tunnel field-effect transistor (TFET) device is provided comprising a semiconductor substrate and a fin structure disposed on the semiconductor substrate. This fin structure comprises a channel region and a source region disposed on the channel region. The TFET device further comprises a drain region contacting the channel region, wherein the source region and the drain region are of opposite conductivity type. The TFET device also comprises a pocket layer covering a gate interface portion of the source region. This gate interface portion of the source region comprises at least three mutually non-coplanar surface segments. The pocket layer furthermore contacts at least part of the channel region. The TFET device also comprises a gate dielectric layer covering the pocket layer and a gate electrode covering the gate dielectric layer.

Figure 2:
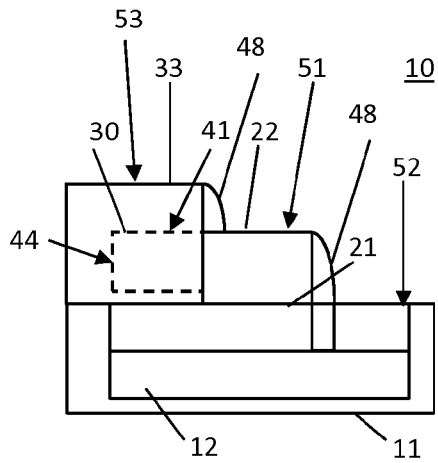
FIG. 2 shows a side view of a TFET device according to a first embodiment.
Figure 3:
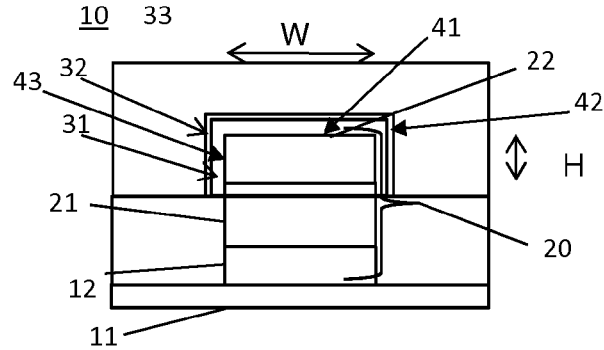
FIG. 3 shows a front view of a TFET device according to a first embodiment.

Referring to FIG. 1 to FIG. 3, a tunnel field-effect transistor device 10 according to a first embodiment is shown in respectively a top view, a side view and a front view. The TFET device 10 comprises a semiconductor substrate 11, for example a silicon substrate, e.g., a silicon on insulator (SOI) substrate.

A TFET according to some embodiments may comprise a semiconductor material selected from at least one of group IV materials such as Si, Ge, C and binary compounds thereof, or group III/V materials such as In, Ga, As, Sb, Al, P, B, N and binary, tertiary and quaternary compounds thereof or II-VI materials such as Cd, Zn, S, Se, Te, O and binary, tertiary and quaternary compounds thereof. The semiconductor material may for example be selected as function of the intended application, e.g. wide bandgap materials may be preferable for high power applications and small bandgap materials may be preferable for low power applications. The source, drain and channel regions and the pocket layer may furthermore comprise the same or different semiconductor materials thus selected, e.g. the source region may comprise Ge or SiGe and the channel region may comprise Si. For example, heterojunctions may be used for tuning of the tunneling onset voltage, e.g. an increase in the tunneling onset due to quantum confinement effects may be compensated by a suitable heterojunction material selection.

The TFET device 10 further comprises a fin structure 20 disposed on the semiconductor substrate 11. The fin structure 20 comprises a channel region 21, e.g. an intrinsic region, and a source region 22 disposed on the channel region 21. The source region 22 may thus be a highly doped region made of a source semiconductor material, e.g. with a doping level of $10^{18}$ cm$^{-3}$ or higher. The channel region 21 may be a lightly doped region, e.g. an undoped or intrinsic region or a region made of a semiconductor material doped at a doping level below $10^{17}$ cm$^{-3}$.

A fin structure refers to an elevated structure with respect to the semiconductor substrate, e.g. a structure contacting the substrate on a major surface the substrate. This fin structure may have a height, e.g. as can be measured in a direction orthogonal to the major surface of the semiconductor substrate on which the fin structure is disposed, a length, e.g. as can be measured in a longitudinal direction X parallel to this major surface, and a width, e.g. as can be measured in a direction orthogonal to both the height direction and the longitudinal direction. The longitudinal direction is furthermore defined, without loss of generality, such that the length is greater than or equal to the width. The fin structure may be an elongate structure such that the length is strictly greater than the width, for example, such that the length is at least twice as large as the width, or such that the length is five times the width or larger.

The TFET device 10 also comprises a drain region 12 contacting the channel region 21. The drain region 12 may thus be a highly doped region made of a drain semiconductor material, e.g. with a doping level of $10^{18}$ cm$^{-3}$ or higher.

The source region 22 and the drain region 12 are of opposite conductivity type. For example, source region 22, channel region 21 and drain region 12 may be linked via a source-channel junction and a channel-drain junction to form a $p^+$-$i$-$n^+$ (for N-TFET) or $n^+$-$i$-$p^+$ (for P-TFET) semiconductor region configuration. Here, $p^+$ refers to a positively doped region, $n^+$ to a negatively doped region and i to an intrinsic region, e.g. a lightly doped region, such as a region having a dopant concentration substantially smaller than the dopant concentration in the positively and negatively doped regions.

The fin structure 20 may furthermore comprise the drain region 12, and the channel region 21 may be disposed on the drain region 12. For example, the structure may comprise a vertical $p^+$-$i$-$n^+$ (for N-TFET) or $n^+$-$i$-$p^+$ (for P-TFET) stack, which may be etched to form a fin-like structure. Thus, the top $p^+$ (N-TFET) or $n^+$ (P-TFET) region of the fin may act as source, and the bottom $n^+$ (N-TFET) or $p^+$ (P-TFET) region of the fin may serve as drain.

The TFET device 10 also comprises a pocket layer 31 covering a gate interface portion 30 of the source region 22 and contacting at least part of the channel region 21. For example, insulating material may be filled around the fin structure 20 until only the source region 22 and a part of the channel region 21 is exposed. A thin pocket layer 31 may be grown over the exposed source region 22 and the part of the channel region 21. Patterning may then be applied to constrain the portion of the pocket layer which covers the source region to the gate interface portion 30. The pocket layer 31 may comprise intrinsic semiconductor material, or the pocket layer 31 may be doped with opposite species than the source region 22, e.g. doped with opposite conductivity than the source. The pocket layer may advantageously doped in order to achieve a tuning of the tunneling onset voltage, e.g. the tunneling threshold voltage. The TFET device 10 further comprises a gate dielectric layer 32 covering the pocket layer 31 and a gate electrode 33 covering the gate dielectric layer 32.

The gate may thus be deposited on one side of the fin structure as shown in FIG. 1 and FIG. 2. This way, area tunneling can be achieved via four mutually non-coplanar surface segments, e.g. the four sides 41, 42, 43, 44 as shown in FIG. 1 to FIG. 3. Therefore, a large tunneling area can be obtained in a small volume, e.g. the tunneling area over source volume ratio of a device according to some embodiments can be advantageously high.

Furthermore, the gate interface portion 30 of the source region 22 comprises at least three mutually non-coplanar surface segments, for example four mutually non-coplanar surface segments 41, 42, 43, 44. Each of the at least three mutually non-coplanar surface segments 41, 42, 43, 44 may be a planar surface segment. Where is referred to mutually non-coplanar, reference is made to each pair of surface segments selected from the at least three surface segments being non-coplanar, e.g. there does not exist a plane in space which comprises both surface segments of the pair.

Each of the at least three mutually non-coplanar surface segments 41, 42, 43, 44 may be oriented either orthogonal, such as e.g. the back surface segment 44 and the side surface segments 42, 43, or parallel, such as e.g. the top surface segment 41, to a surface of the semiconductor substrate 11 on which the fin structure 20 is disposed. It will be apparent to the person skilled in the art that orthogonal and parallel refer to being disposed at an angle in relation to the substrate which corresponds to substantially 90 degrees and 0 degrees respectively, e.g. taking a manufacturing tolerance into account, e.g. in the range of 89° and 91° or in the range of 85° to 95° for orthogonality and in the range of −1° and 1° or in the range of −5° to 5° for parallelity. Thus, four line tunneling areas may be provided in the TFET device, e.g. a top surface 41, a back surface 44 and two side surfaces 42, 43. The total tunneling area may therefore be substantially equal to 2.H.L+W.L+W.H for the first exemplary embodiment 10, in which the height H, length L and width W correspond to the principal dimensions of the gate interface portion 30 as indicated in FIG. 1 to FIG. 3. These device-specific dimension parameters H, L and W may be optimized as function of the intended application requirements, e.g. by experimental or simulation optimization.

The gate interface portion 30 may comprise an end portion of the source region 22 with respect to a longitudinal direction X along which the fin structure 20 extends over the semiconductor substrate 11.

Furthermore, the TFET device 10 may comprise a source contact 51 for providing an electrical interface to the source region 22, a drain contact 52 for providing an electrical interface to the drain region 12 and a gate contact 53 for providing an electrical interface to the gate electrode 33. Such contacts 51, 52, 53 may for example be metallized surface segments of the source region 22, drain region 12 and gate electrode 33 respectively. The contacts 51, 52, 53 may be adapted for providing low electrical resistance interfaces for connecting other integrated components to the TFET device in a semiconductor integrated circuit system.

The source contact may be disposed besides gate when viewed from the top. The drain may be reached by etching the source region and the channel region. Furthermore, spacers 48 may be provided along the gate and source-channel region side wall. Such spacers 48 may advantageously allow silicidation to be carried out simultaneously for gate, source, and drain contacts in a manufacturing process. The spacers can for example comprise SiN material.

The source contact 51 may be disposed between the drain contact 52 and the gate contact 53 along the longitudinal direction X. Thus, in embodiments such as the exemplary first embodiment depicted in FIG. 1 to FIG. 3, the source and drain contacts are taken at the same side of the gate contact. It is an advantage of such arrangement that tunneling can occur via the four surface segments 41, 42, 43, 44.

In case of a N-TFET device, when sufficient gate bias is applied, e.g. by applying a voltage potential over the gate contact and the source contact, the valence band of the source aligns with conduction sub-bands of the pocket, such that tunneling of carriers from source to pocket begins and the device turns ON. In case of a P-TFET device, when sufficient gate bias is applied, the conduction band of the source aligns with valence sub-bands of the pocket, such that tunneling begins and the device turns ON. The tunneled carriers are collected by the drain, which may be reached via the channel region, e.g. the intrinsic region.

Figure 4:
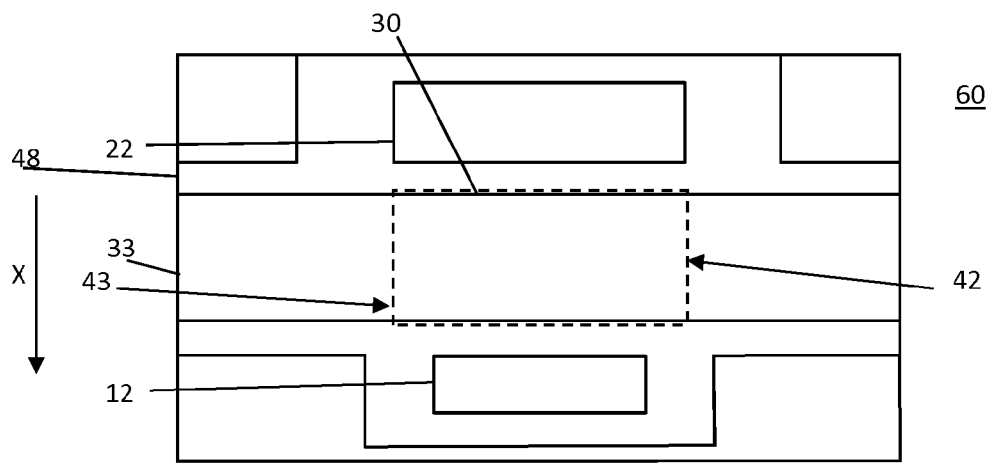
FIG. 4 shows a top view of a TFET device according to a second embodiment.

Referring to FIG. 4 to FIG. 6, a tunnel field-effect transistor device 60 according to a second embodiment is shown in respectively a top view, a side view and a front view. The TFET device 60 is generally similar to the TFET device 10 illustrated in FIG. 1 to FIG. 3. The TFET device 60 also comprises a semiconductor substrate 11. The TFET device 60 also comprises a fin structure 20 disposed on the semiconductor substrate 11. The fin structure 20 comprises a channel region 21 and a source region 22 disposed on the channel region 21. The TFET device 60 also comprises a drain region 12 contacting the channel region 21. The source region 22 and the drain region 12 are of opposite conductivity type. For example, source region 22, channel region 21 and drain region 12 may be linked via a source-channel junction and a channel-drain junction to form a p+-i-n+ (for N-TFET) or n+-i-p+ (for P-TFET) semiconductor region configuration.

The fin structure 20 may furthermore comprise the drain region 12, and the channel region 21 may be disposed on the drain region 12.

The TFET device 60 also comprises a pocket layer 31 covering a gate interface portion 30 of the source region 22 and contacting at least part of the channel region 21. The pocket layer 31 may be doped with opposite species than the source region 22.

The TFET device 60 further comprises a gate dielectric layer 32 covering the pocket layer 31 and a gate electrode 33 covering the gate dielectric layer 32.

However, unlike the TFET device 10 according to the first exemplary embodiment, the gate may be deposited in the center of the fin structure as shown in FIG. 4 and FIG. 5. Instead of depositing the gate at the edge of the fin, it may be deposited at the center of the fin.

The gate interface portion 30 of the source region 22 comprises at least three mutually non-coplanar surface segments, for example three mutually non-coplanar surface segments 41, 42, 43. Each of the at least three mutually non-coplanar surface segments 41, 42, 43 may be a planar surface segment. Each of the at least three mutually non-coplanar surface segments 41, 42, 43 may be oriented either orthogonal, such as the side surface segments 42, 43, or parallel, such as e.g. the top surface segment 41, to a surface of the semiconductor substrate 11 on which the fin structure 20 is disposed.

Thus, three line tunneling areas may be provided in the TFET device, e.g. a top surface 41 and two side surfaces 42, 43. The total tunneling area may therefore be substantially equal to 2.H.L+W.L for the second exemplary embodiment 60, in which the height H, length L and width W correspond to the principal dimensions of the gate interface portion 30.

The gate interface portion 30 may be spaced away from the end portions, e.g. the ends or external points, with respect to the longitudinal direction X along which the fin structure 20 extends over the semiconductor substrate 11. For example, the gate interface portion 30 may comprise a central portion of the source region 22 with respect to the longitudinal direction X along which the fin structure 20 extends over the semiconductor substrate 11, while the gate interface portion 30 does not comprise an end portion of the source region with respect to the longitudinal direction.

Furthermore, the TFET device 60 may comprise a source contact 51 for providing an electrical interface to the source region 22, a drain contact 52 for providing an electrical interface to the drain region 12 and a gate contact 53 for providing an electrical interface to the gate electrode 33. Such contacts 51, 52, 53 may for example be metallized surface segments of the source region 22, drain region 12 and gate electrode 33 respectively. The contacts 51, 52, 53 may be adapted for providing low electrical resistance interfaces for connecting other integrated components to the TFET device in a semiconductor integrated circuit system.

The gate contact 53 may be disposed between the source contact 51 and the drain contact 52 along the longitudinal direction X. Thus, in embodiments such as the exemplary second embodiment depicted in FIG. 4 to FIG. 6, the source contact may be taken from one side of the gate contact, while the drain contact may be taken from the other side on the fin with respect to the gate contact. It is an advantage of such arrangement that ON-state tunneling can occur via the three surface segments 41, 42, 43. Although the tunneling area per unit of volume of the TFET may be smaller as compared to the first exemplary embodiment discussed hereinabove, a more compact device may be provided by connecting to the source and drain from opposite sides of the gate.

Referring to FIG. 7 to FIG. 9, a tunnel field-effect transistor device 70 according to a third embodiment is shown in respectively a top view, a side view and a front view. The TFET device 70 is generally similar to the TFET device 10 illustrated in FIG. 1 to FIG. 3. The TFET device 70 also comprises a semiconductor substrate 11. The TFET device 70 also comprises a fin structure 20 disposed on the semiconductor substrate 11. The fin structure 20 comprises a channel region 21 and a source region 22 disposed on the channel region 21. The TFET device 70 also comprises a drain region 12 contacting the channel region 21. The source region 22 and the drain region 12 are of opposite conductivity type. For example, source region 22, channel region 21 and drain region 12 may be linked via a source-channel junction and a channel-drain junction to form a p+-i-n+ (for N-TFET) or n+-i-p+ (for P-TFET) semiconductor region configuration.

The fin structure 20 may furthermore comprise the drain region 12, and the channel region 21 may be disposed on the drain region 12.

The TFET device 70 also comprises a pocket layer 31 covering a gate interface portion 30 of the source region 22 and contacting at least part of the channel region 21. The pocket layer 31 may be doped with opposite species than the source region 22.

The TFET device 70 further comprises a gate dielectric layer 32 covering the pocket layer 31 and a gate electrode 33 covering the gate dielectric layer 32. The gate may also be deposited at an end of the fin, similar to the first exemplary embodiment shown in FIG. 1 to FIG. 3.

The gate interface portion 30 of the source region 22 comprises at least three mutually non-coplanar surface segments, for example three mutually non-coplanar surface segments 42, 43, 44. Each of the at least three mutually non-coplanar surface segments 42, 43, 44 may be a planar surface segment. Each of the at least three mutually non-coplanar surface segments 42, 43, 44 may be oriented orthogonal to a surface of the semiconductor substrate 11 on which the fin structure 20 is disposed.

Thus, three line tunneling areas may be provided in the TFET device, e.g. a back surface 44 and two side surfaces 42, 43. The total tunneling area may therefore be substantially equal to 2.H.L+W.H for the third exemplary embodiment 70, in which the height H, length L and width W correspond to the principal dimensions of the gate interface portion 30.

The TFET device 60 may comprise a source contact 51 for providing an electrical interface to the source region 22, a drain contact 52 for providing an electrical interface to the drain region 12 and a gate contact 53 for providing an electrical interface to the gate electrode 33. Such contacts 51, 52, 53 may for example be metallized surface segments of the source region 22, drain region 12 and gate electrode 33 respectively. The contacts 51, 52, 53 may be adapted for providing low electrical resistance interfaces for connecting other integrated components to the TFET device in a semiconductor integrated circuit system.

In the TFET device 70 according to the third exemplary embodiment, the gate interface portion 30 may comprise an end portion of the source region 22 with respect to a longitudinal direction X along which the fin structure 20 extends over the semiconductor substrate 11. In the TFET device 70, the source contact 51 may be at least partially surrounded by the gate electrode 33.

It is an advantage of such arrangement that ON-state tunneling can occur via the three surface segments 42, 43, 44. Although the tunneling area per unit of volume of the TFET may be smaller as compared to the first exemplary embodiment discussed hereinabove, a more compact device may be provided by connecting to the source via a contact at least partially surrounded by the gate electrode. For example, the top surface of the gate structure may be etched away after depositing the gate in order to provide access to the source region underneath.

Therefore, a difference between the first exemplary embodiment 10 and the third exemplary embodiment 70 may be that the source contact is taken on the top of the fin by removing the gate from the top region. An advantage of this difference is compactness of the layout. The source contact does not require additional space since it is placed in between the gate. As a result, a TFET 70 according to this exemplary embodiment may have only three surfaces, e.g. back 44, left 42 and right 43 sides, over which tunneling occurs. Another advantage is lower OFF current compared to the previous exemplary embodiments due to a smaller achievable source-channel interface area. The channel region, e.g. the intrinsic layer between source and drain, may affect the OFF state leakage and ON state resistance. The OFF state leakage may be dependent on the area of the source region, e.g. the area of the interface between the source region and the channel region. This area may be kept advantageously small by taking the source contact from the top surface as demonstrated by this third exemplary embodiment.

Referring to FIG. 10 to FIG. 12, a tunnel field-effect transistor device 80 according to a fourth embodiment is shown in respectively a top view, a side view and a front view. The TFET device 80 is generally similar to the TFET device 60 illustrated in FIG. 4 to FIG. 6. The TFET device 80 comprises a semiconductor substrate 11. The TFET device 80 also comprises a fin structure 20 disposed on the semiconductor substrate 11. The fin structure 20 comprises a channel region 21 and a source region 22 disposed on the channel region 21. The TFET device 80 also comprises a drain region 12 contacting the channel region 21. The source region 22 and the drain region 12 are of opposite conductivity type.

However, unlike the TFET 60 according to the second exemplary embodiment described hereinabove, here the channel region 21 is not disposed on the drain region 12. Instead, the TFET device 80 comprises a drain region 52 which is disposed on the channel region 21, e.g. contacting the channel region 21 and may be arranged beside the gate.

The TFET devices according to the first, second and third exemplary embodiment may be provided by pocket last processes, where the drain region and source region may have been disposed on top of each other separated by the channel region. Thus the OFF current may have been determined by the area of overlap of source/drain in those embodiments. However, in the TFET device 80 according to the fourth exemplary embodiment, the source region and the drain region may be more effectively separated by using a drain last process. Thus, the source region may have been removed on one side of gate, and the drain region may have been provided on the thus exposed channel region. A spacer 48 may electrically insulate the drain region from the source region. Furthermore, the channel region may have been extended, e.g. further grown on the exposed channel region material, before the drain region was provided thereon, e.g. in order to provide a larger area of contact between the drain region and the channel region.

The gate interface portion 30 of the source region 22 comprises at least three mutually non-coplanar surface segments, for example three mutually non-coplanar surface segments 41, 42, 43. Each of the at least three mutually non-coplanar surface segments 41, 42, 43 may be a planar surface segment. Each of the at least three mutually non-coplanar surface segments 41, 42, 43 may be oriented either orthogonal, such as the side surface segments 42, 43, or parallel, such as e.g. the top surface segment 41, to a surface of the semiconductor substrate 11 on which the fin structure 20 is disposed.

Thus, three line tunneling areas may be provided in the TFET device, e.g. a top surface 41 and two side surfaces 42, 43. The total tunneling area may therefore be substantially equal to 2.H.L+W.L for the fourth exemplary embodiment 80, in which the height H, length L and width W correspond to the principal dimensions of the gate interface portion 30.

The gate interface portion 30 may be spaced away from the end portions, e.g. the ends or external points, with respect to the longitudinal direction X along which the fin structure 20 extends over the semiconductor substrate 11. For example, the gate interface portion 30 may comprise a central portion of the source region 22 with respect to the longitudinal direction X along which the fin structure 20 extends over the semiconductor substrate 11, while the gate interface portion 30 does not comprise an end portion of the source region with respect to the longitudinal direction.

Furthermore, the TFET device 80 may comprise a source contact 51 for providing an electrical interface to the source region 22, a drain contact 52 for providing an electrical interface to the drain region 12 and a gate contact 53 for providing an electrical interface to the gate electrode 33. Such contacts 51, 52, 53 may for example be metallized surface segments of the source region 22, drain region 12 and gate electrode 33 respectively. The contacts 51, 52, 53 may be adapted for providing low electrical resistance interfaces for connecting other integrated components to the TFET device in a semiconductor integrated circuit system.

The gate contact 53 may be disposed between the source contact 51 and the drain contact 52 along the longitudinal direction X. Thus, in embodiments such as the exemplary second embodiment depicted in FIG. 4 to FIG. 6, the source contact may be taken from one side of the gate contact, while the drain contact may be taken from the other side on the fin with respect to the gate contact. It is an advantage of such arrangement that ON-state tunneling can occur via the three surface segments 41, 42, 43. Although the tunneling area per unit of volume of the TFET may be smaller as compared to the first exemplary embodiment discussed hereinabove, a more compact device may be provided by connecting to the source and drain from opposite sides of the gate.

A tunnel field-effect transistor device according to a fifth embodiment (not depicted in the figures) may be generally similar to the tunnel field-effect transistor device according to the fourth embodiment. The TFET device comprises a semiconductor substrate. The TFET device also comprises a fin structure disposed on the semiconductor substrate. The fin structure comprises a channel region and a source region disposed on the channel region. The TFET device also comprises a drain region contacting the channel region. The source region and the drain region are of opposite conductivity type.

The channel region is not disposed on the drain region but on the channel region, e.g. contacting the channel region and may be arranged beside the gate. However, unlike the TFET according to the fourth exemplary embodiment described hereinabove, the gate interface portion of the source region comprises four mutually non-coplanar surface segments (as described in the first exemplary embodiment) instead of three. The total tunneling area may therefore be substantially equal to 2.H.L+W.L+W.H for the fifth exemplary embodiment, in which the height H, length L and width W correspond to the principal dimensions of the gate interface portion.

The gate interface portion 30 may comprise an end portion of the source region with respect to a longitudinal direction X along which the fin structure extends over the semiconductor substrate.

Furthermore, the TFET device may comprise a source contact for providing an electrical interface to the source region, a drain contact for providing an electrical interface to the drain region and a gate contact for providing an electrical interface to the gate electrode.

The source contact may be disposed besides gate when viewed from the top. The drain may be reached by etching the source region and the channel region.

The source contact may be disposed between the drain contact and the gate contact along the longitudinal direction X. Thus, in embodiments such as the exemplary fifth embodiment, the source and drain contacts are taken at the same side of the gate contact. It is an advantage of such arrangement that tunneling can occur via the four surface segments 41, 42, 43, 44.

In a second aspect, a method is provided for manufacturing a tunnel field-effect transistor device. Such method comprises growing a stack on a semiconductor substrate, said stack comprising a channel region and a source region disposed on said channel region. The method also comprises etching the stack to form a fin structure on the semiconductor substrate. Furthermore, the method comprises providing a gate structure on the fin structure, the gate structure comprising a pocket layer covering a gate interface portion of the source region and contacting at least part of the channel region, a gate dielectric layer disposed on said pocket layer and a gate electrode disposed on said gate dielectric layer. The method further comprises providing a drain region of opposite conductivity type with respect to the source region, said drain region being disposed such as to contact the channel region. The gate interface portion furthermore comprises at least three mutually non-coplanar surface segments.

Figure 13:
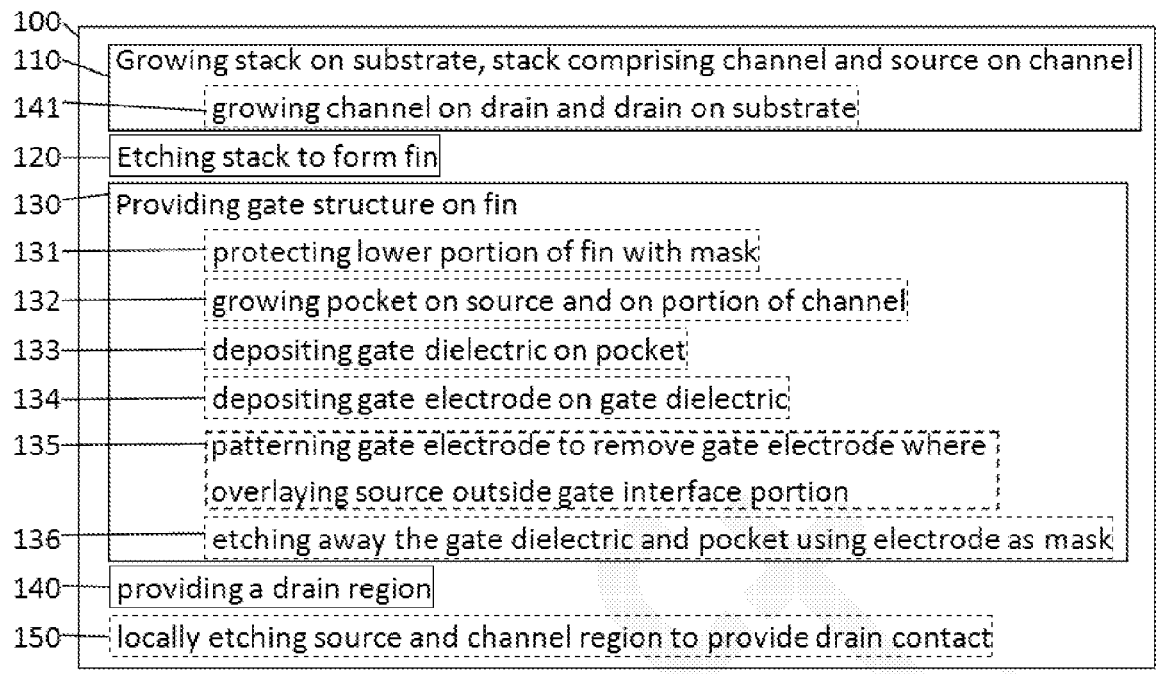
FIG. 13 shows a method according to an embodiment of the second aspect.

FIG. 13 shows a method 100 according to some embodiments of this second aspect.

The method 100 for manufacturing a tunnel field-effect transistor device comprises growing 110 a stack on a semiconductor substrate, said stack comprising a channel region and a source region disposed on said channel region. In a method according to some embodiments, growing the stack on the semiconductor substrate may also comprise growing 141 the drain region on the semiconductor substrate, growing the channel region on the drain region and growing the source region on the channel region.

The method 100 further comprises etching 120 the stack to form a fin structure on the semiconductor substrate.

Furthermore, the method 100 comprises providing 130 a gate structure on the fin structure, the gate structure comprising a pocket layer covering a gate interface portion of the source region and contacting at least part of the channel region, a gate dielectric layer disposed on the pocket layer and a gate electrode disposed on the gate dielectric layer. The gate interface portion comprises at least three mutually non-coplanar surface segments.

In a method 100 according to some embodiments, providing 130 the gate structure may comprise protecting 131 the semiconductor substrate and a lower portion of the fin with an isolation mask such that the source region and a portion of the channel region remain exposed. Providing 130 the gate structure may further comprise growing 132 the pocket layer on the source region and on said portion of the channel region. Providing 130 the gate structure may also comprise depositing 133 the gate dielectric layer on the pocket layer, and depositing 134 the gate electrode on the gate dielectric layer.

Furthermore, providing 130 the gate structure may comprise patterning 135 the gate electrode such as to remove the gate electrode material overlaying the source region outside said gate interface portion, and etching 136 away the gate dielectric layer and the pocket layer using said gate electrode as mask.

In a method according to some embodiments, providing the gate structure may furthermore comprise isotropic etching of the source region before growing the pocket layer in order to align, e.g. geometrically align, the pocket layer with the channel region.

For example, the source region may be isotropically etched such that at least one outer surface of the pocket layer, e.g. a surface of the pocket layer which is distal to the source region, is aligned to a corresponding fin structure surface of the channel region and/or drain region. Such isotropic etching may for example be advantageous in providing a smooth structure to avoid gate dielectric reliability issues, although the corner edges of the structure obtained without isotropically etching the source region may provide an enhanced electric field at the corners and edges of the Fin.

The method 100 further comprises providing 140 a drain region of opposite conductivity type with respect to the source region, wherein the drain region is disposed such as to contact the channel region.

A method 100 according to some embodiments may furthermore comprise locally etching away 150 the source region and the channel region to expose a drain contact for providing an electrical interface to the drain region.

Four exemplary methods according to the second aspect will be presented hereinbelow, these exemplary methods being adapted for producing field-effect transistors according to respectively the first, second, third and fourth exemplary embodiment of the first aspect discussed hereinabove.

Figure 14:
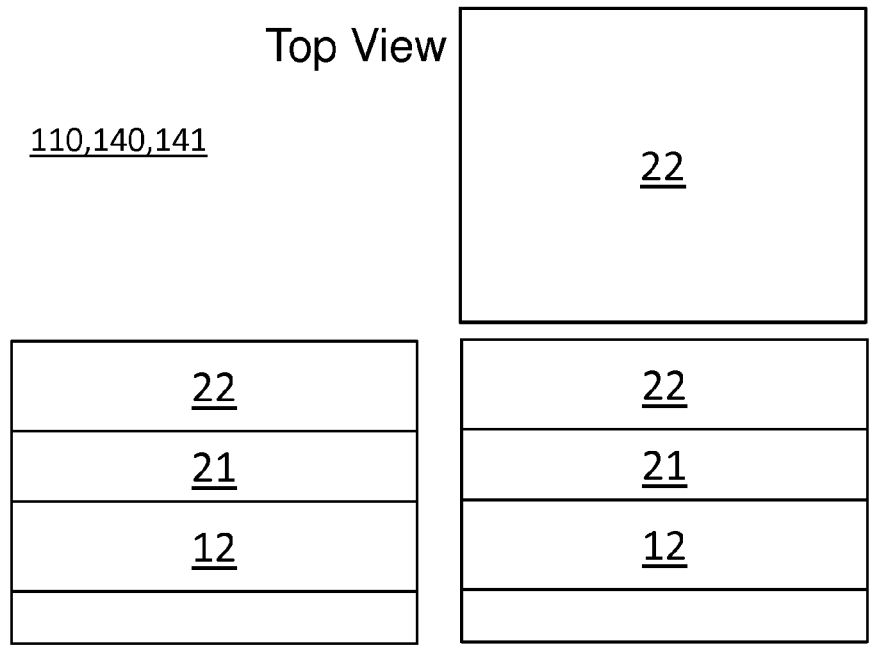
FIG. 14 shows the result of growing a stack on a semiconductor substrate in a first exemplary method according to an embodiment.

The first step of the first exemplary method comprises growing 110 a stack on a semiconductor substrate, in which this stack comprises a channel region and a source region disposed on the channel region. Furthermore, growing the stack on the semiconductor substrate in this first step of the first exemplary method also comprises growing 141 the drain region on the semiconductor substrate, growing the channel region on the drain region and growing the source region on the channel region. For example, a top p+ (N-TFET) or n+ (P-TFET) region may act as source and a bottom n+ (N-TFET) or (P-TFET) p+ region may serve as drain. Thus, this first process step may comprise the blanket epi-growth of a p-i-n stack, the result of which is illustrated in FIG. 14.

Figure 15:
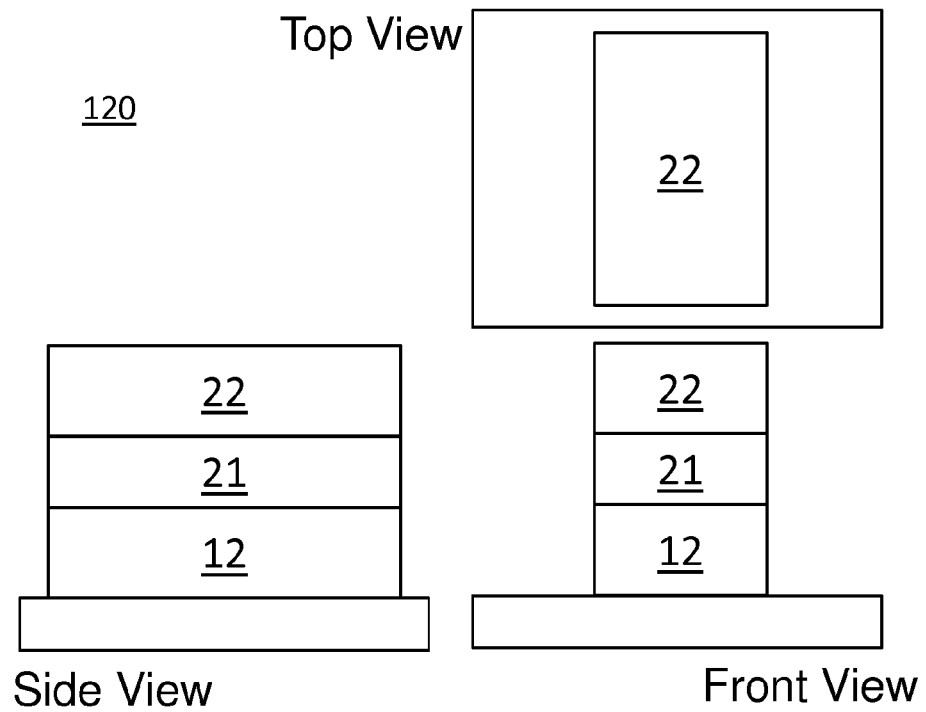
FIG. 15 shows the result of etching the stack to form a fin structure on the semiconductor substrate in a first exemplary method according to an embodiment.

The second step of the first exemplary method comprises etching 120 the stack to form a fin structure on the semiconductor substrate. Thus, the p-i-n stack may be etched to form a Fin-like structure, the result of which is schematically illustrated in FIG. 15. For example, a hard mask may be used for etching of the fin structure and this hard mask may be removed after etching of the fin structure.

In the following steps of the first exemplary method, the gate structure is provided 130.

Figure 16:
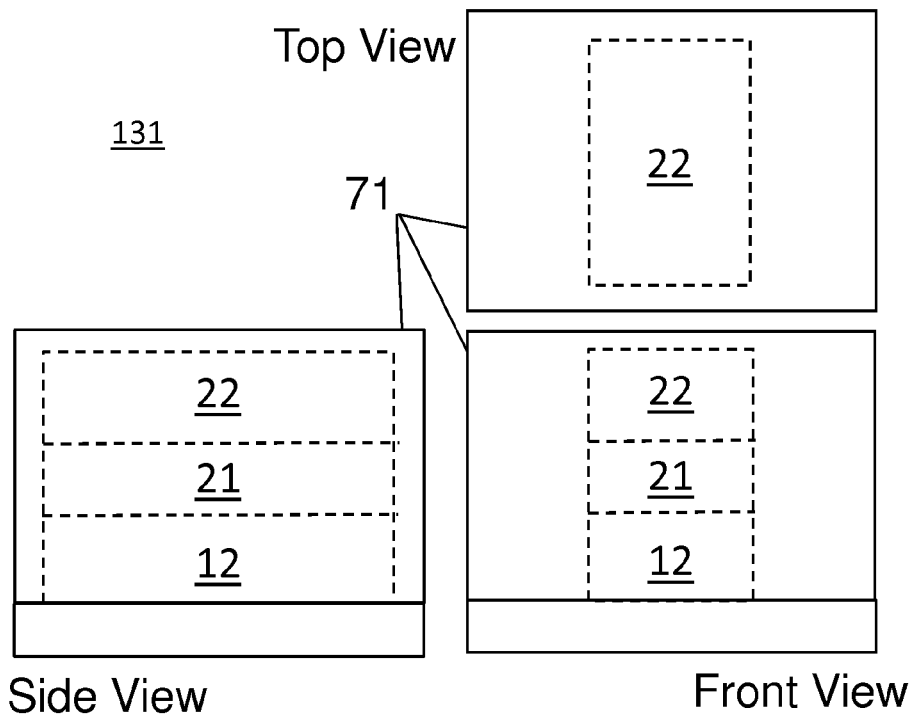
FIG. 16 shows the intermediate result of protecting the semiconductor substrate and a lower portion of the fin with an isolation mask in a first exemplary method according to an embodiment.
Figure 17:
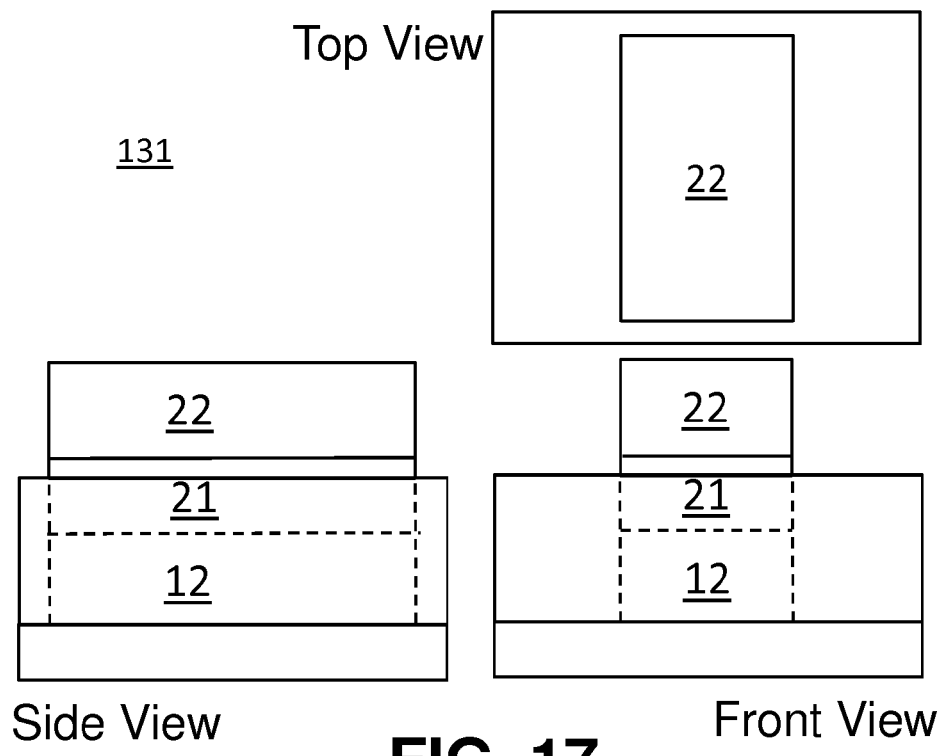
FIG. 17 shows the result after etching the fill oxide until the channel region starts to show-up in a first exemplary method according to an embodiment.

FIG. 16 shows the intermediate result of a step of protecting 131 the semiconductor substrate and a lower portion of the fin with an isolation mask 71 such that the source region 22 and a portion of the channel region 21 remain exposed. Insulating material 71 may thus be filled around the Fin until only the top p+(N-TFET) or n+(P-TFET) part of Fin and a small portion of the channel region 21 remains exposed. In FIG. 16 the fin is shown while submerged in a fill oxide 71 and the top surface is polished or planarized by for example the application of a chemo-mechanical polishing (CMP) technique. FIG. 17 shows the result after furthermore etching the fill oxide 71 until the channel region 21, e.g. the intrinsic region 21, starts to show-up. Optionally, isotropic etching of the source region 22 may be applied for alignment of the pocket 31 with the channel region 21.

Figure 18:
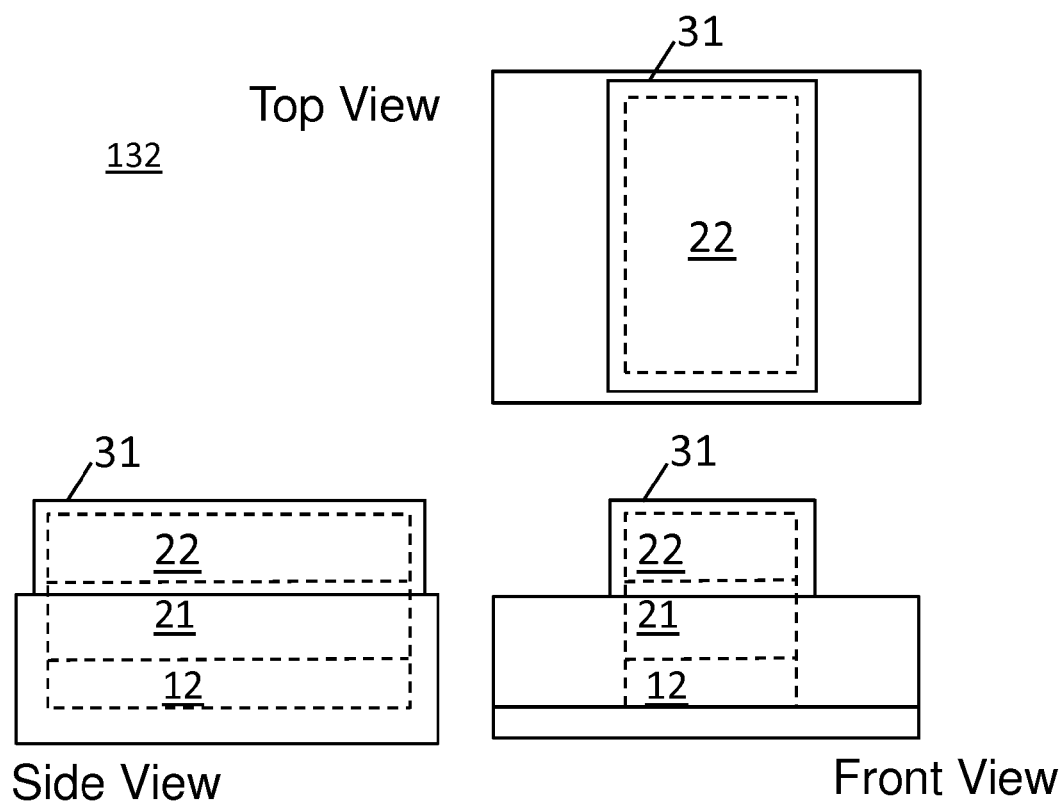
FIG. 18 shows the intermediate product after growth of a pocket layer over the source region and the portion of the channel region which were left exposed by the fill oxide in a first exemplary method according to an embodiment.

Providing 130 the gate structure may further comprise growing 132 the pocket layer 31 on the source region 22 and on said portion of the channel region 21. For example, a thin pocket layer 31 may be grown over the top p+(N-TFET) or n+(P-TFET) followed by gate dielectric 32 deposition. The pocket 31 may be doped with opposite species than the source region 22. FIG. 18 shows the intermediate product after growth of a pocket layer 31 over the source region 22 and the portion of the channel region 21 which were left exposed by the fill oxide 71.

Figure 19:
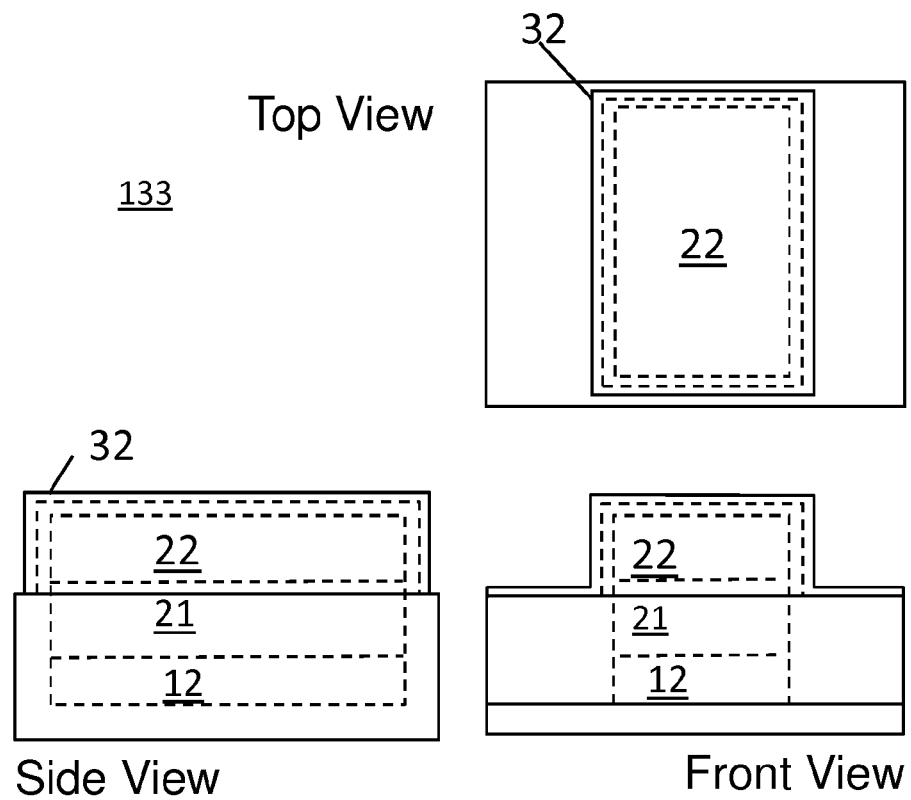
FIG. 19 shows the intermediate product after depositing the gate dielectric layer on the pocket layer in a first exemplary method according to an embodiment.
Figure 20:
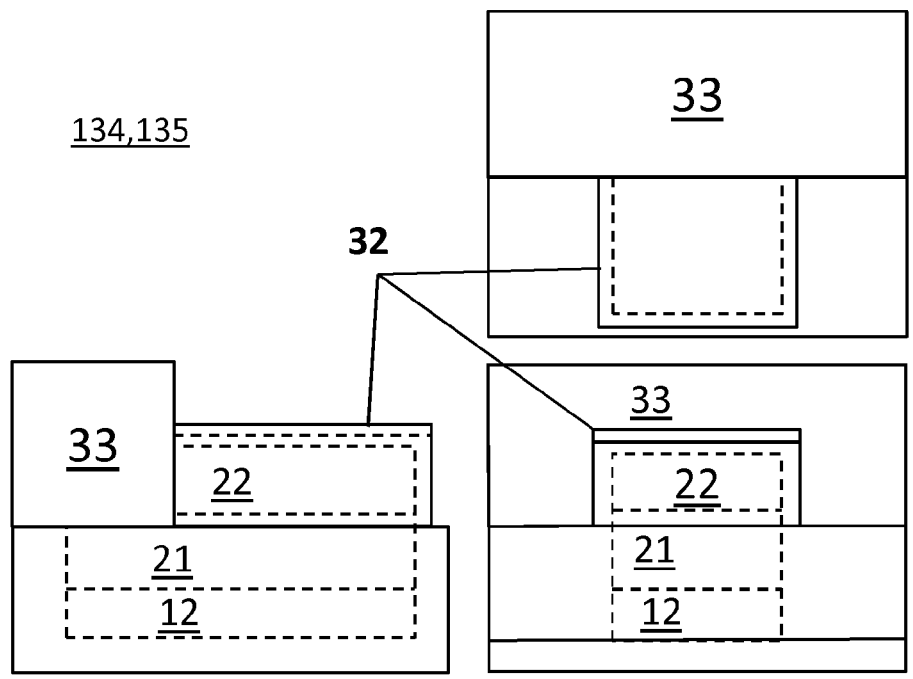
FIG. 20 shows the result of depositing the gate electrode on the gate dielectric layer and patterning the gate electrode in a first exemplary method according to an embodiment.

FIG. 19 furthermore shows the intermediate product after the next step of depositing 133 the gate dielectric layer 32 on the pocket layer 31, and FIG. 20 shows the result of depositing 134 the gate electrode 33 on the gate dielectric layer 32 and patterning 135 the gate electrode 33 such as to remove the gate electrode material 33 overlaying the source region 22 outside the gate interface portion.

The gate may thus be deposited on one side of the Fin as shown in top and side view on FIG. 20. This way, area tunneling can be achieved via four sides, e.g. four mutually non-coplanar surface segments. This enables tunneling over a large tunneling area in a relatively small volume.

In embodiments of the second aspect, providing of the gate structure may be adapted such that the gate interface portion of the source region 22 comprises an end portion of the source region 22 with respect to a longitudinal direction along which the fin structure extends over the semiconductor substrate, as for example illustrated by the patterned gate electrode 33 shown in FIG. 20.

Figure 21:
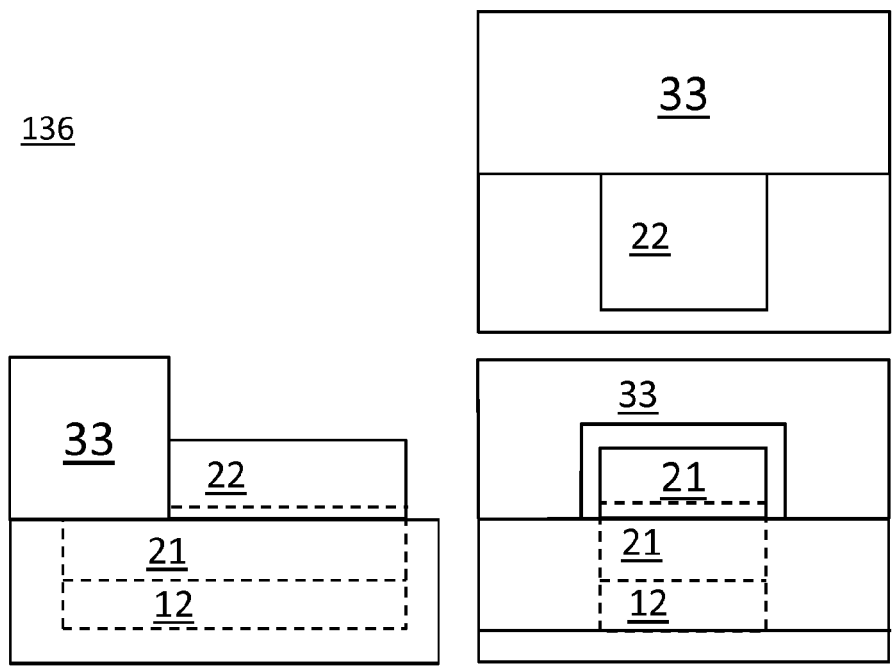
FIG. 21 shows the intermediate product after etching away the gate dielectric layer and the pocket layer using the gate electrode as mask in a first exemplary method according to an embodiment.

FIG. 21 shows the intermediate product after the next step of etching 136 away the gate dielectric layer 32 and the pocket layer 31 using the gate electrode 33 as mask.

Figure 22:
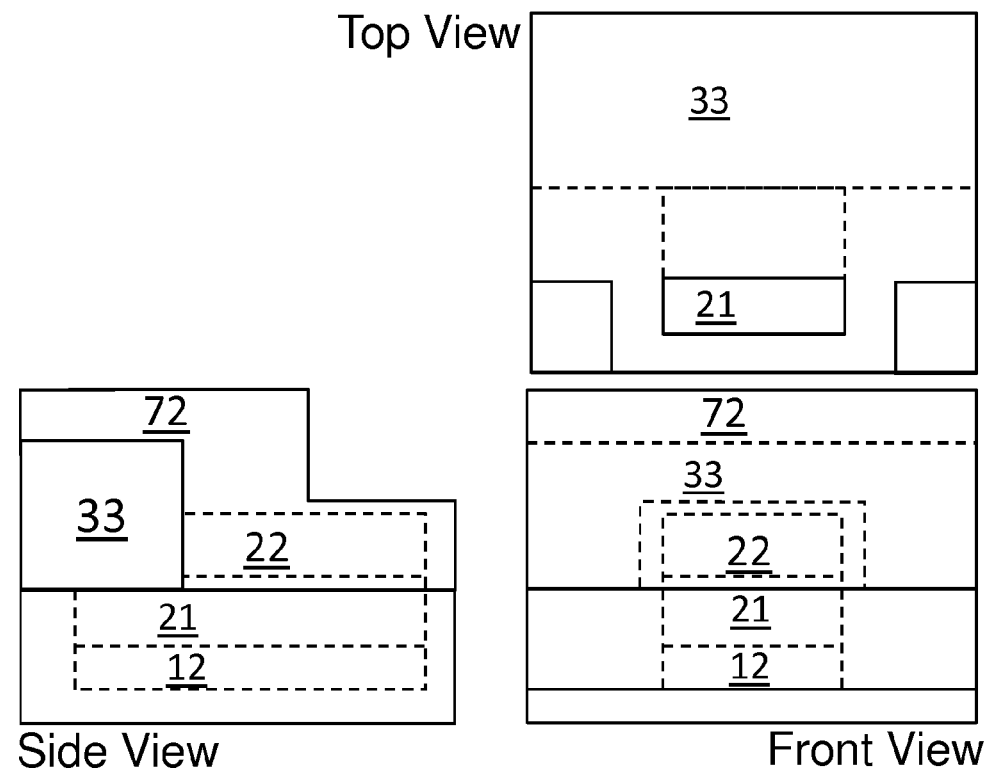
FIG. 22 illustrates the product after deposition of a hard mask, e.g. a silicon nitride hard mask, and the patterning of this mask to expose the drain region for etching in a first exemplary method according to an embodiment.
Figure 23:
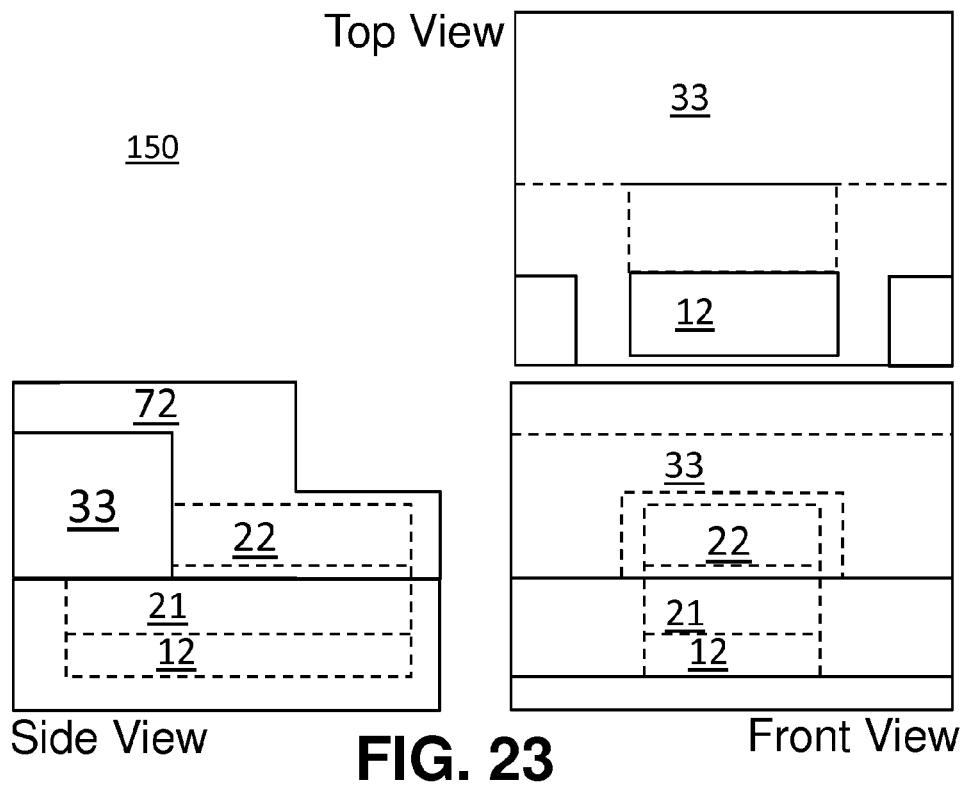
FIG. 23 shows the intermediate product after selectively etching away the gate dielectric, source region and the channel region on the drain side to expose the drain region in a first exemplary method according to an embodiment.
Figure 24:
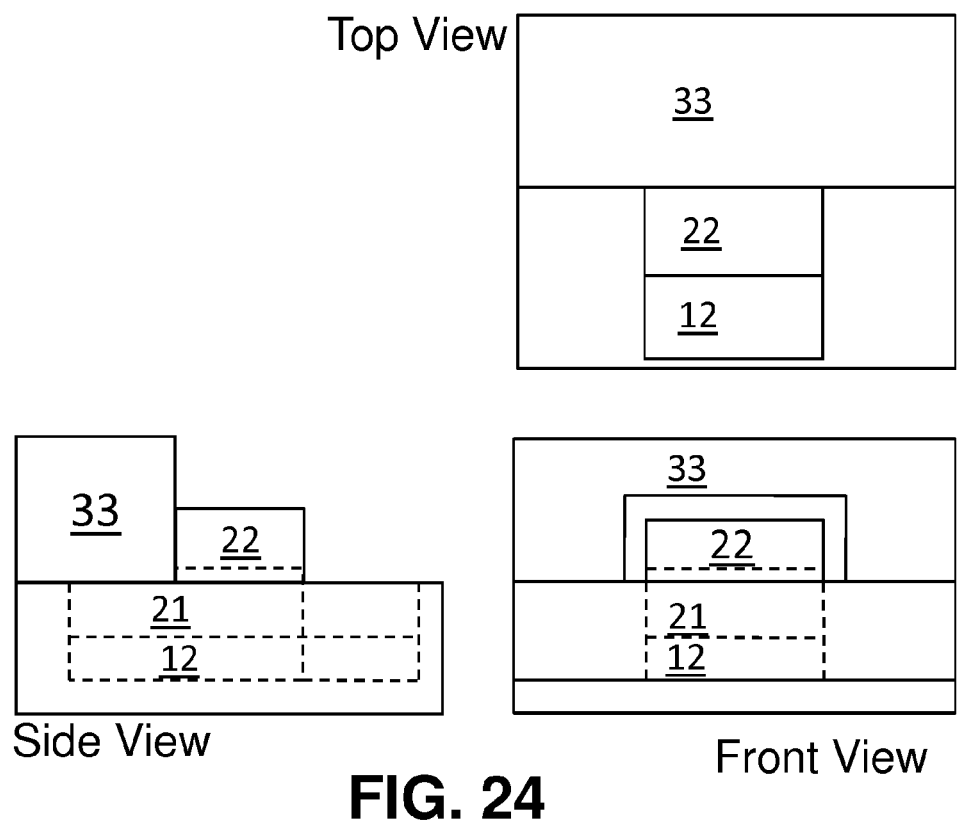
FIG. 24 shows the result after stripping of the nitride hard mask in a first exemplary method according to an embodiment.

The first exemplary method further comprises locally etching away 150 the source region 22 and the channel region 21 to expose a drain contact for providing an electrical interface to the drain region 12. For example, FIG. 22 illustrates the product after the deposition of a hard mask 72, e.g. a silicon nitride hard mask 72, and the patterning of this mask 72 to expose the drain region 12 for etching. Then, as shown in FIG. 23, the gate dielectric 32, source region 22 (e.g. the p+ region) and the channel region 21 (e.g. the intrinsic layer 21) may be selectively etched away on the drain side to expose the drain region 12 (e.g. the n+ region). FIG. 24 shows the result after stripping of the nitride hard mask 22.

Figure 25:
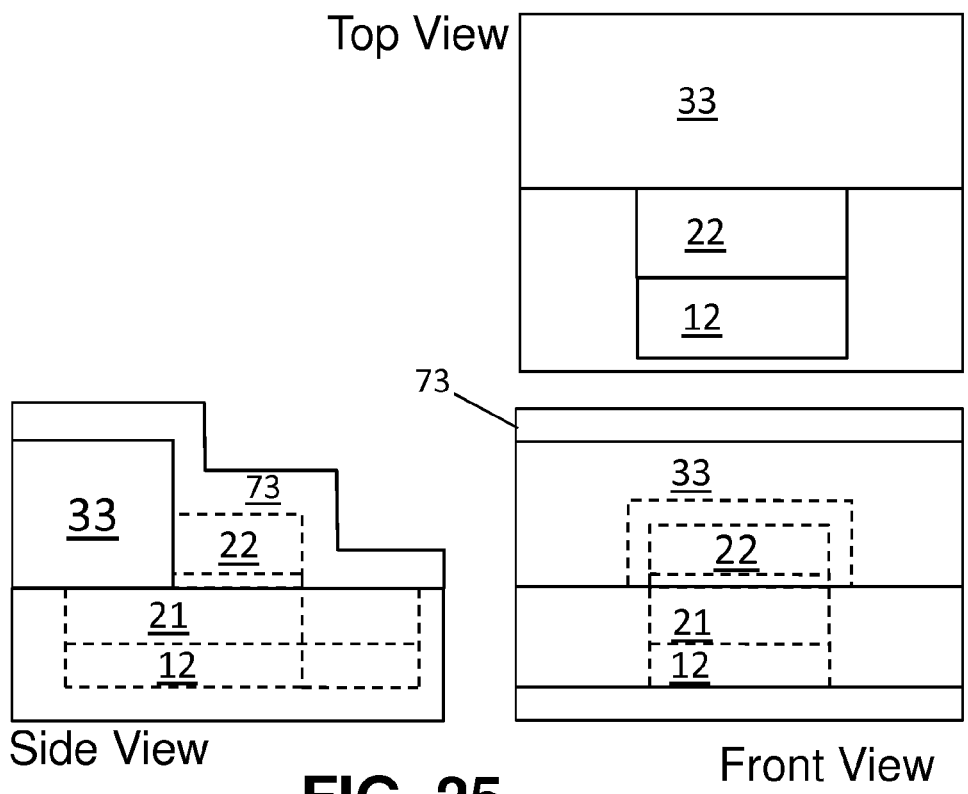
FIG. 25 shows the result after etching the nitride hard mask in a first exemplary method according to an embodiment.
Figure 26:
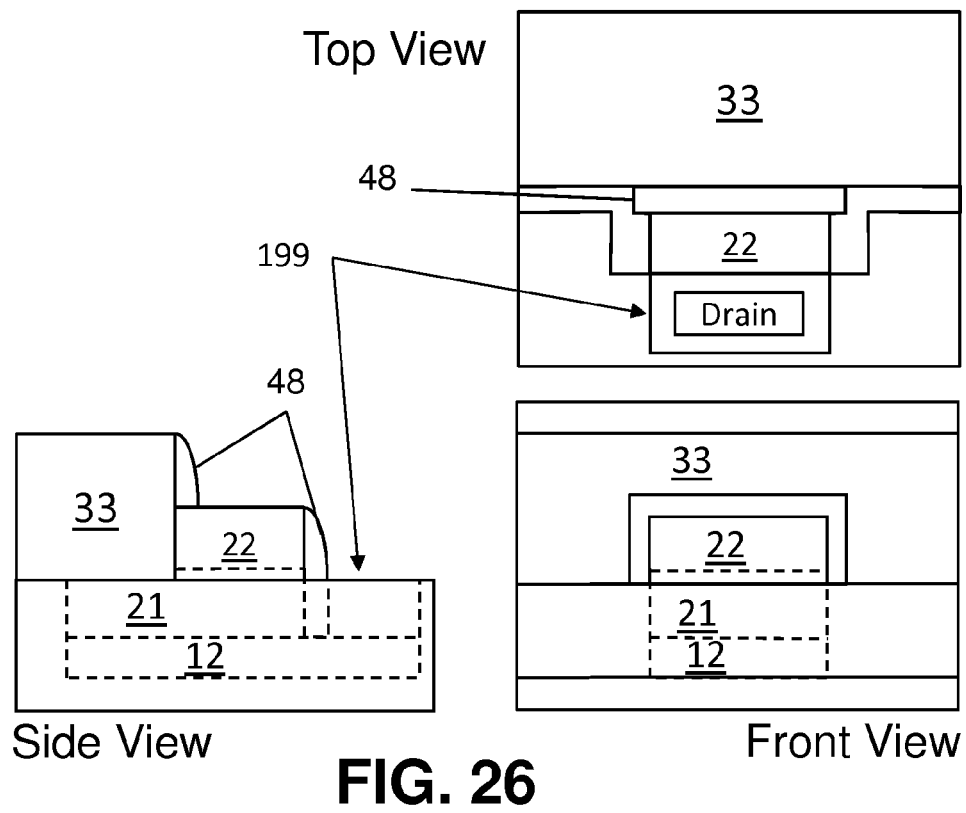
FIG. 26 shows the result after forming contact spacers in a first exemplary method according to an embodiment.

In a next step, a thin layer of nitride 25 may be deposited, as shown in FIG. 25. Then, this nitride 25 may be etched to form contact spacers 48, including a spacer 48 along the oxide inner side wall 199 around the exposed part of the drain region 12, as illustrated by FIG. 26.

Figure 27:
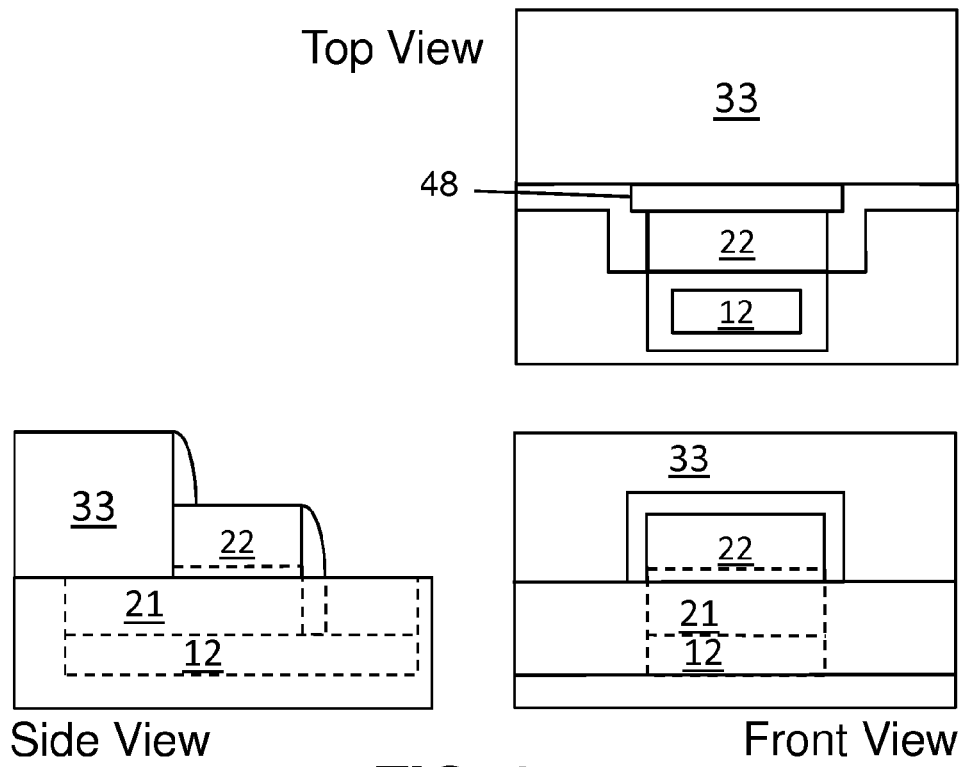
FIG. 27 shows the TFET device obtained after metallizing the drain region, source region and gate electrode in a first exemplary method according to an embodiment.

In a final step, the drain region 12, source region 22 and gate electrode 33 may be metalized where left exposed by the contact spacers 48. Thus, the TFET device depicted in FIG. 27 can be obtained.

Thus, the source contact can be taken besides the gate structure when viewed from above. The drain 12 can be reached by etching the source 22 and intrinsic 21 regions, and spacers 48 may be formed along the gate and source-intrinsic region side wall. Thus, silicidation may advantageously be carried out simultaneously for gate, source and drain contacts.

The second exemplary method proceeds along the same steps of the first exemplary method up until the deposition of the gate electrode 33, depicted in FIG. 14 to FIG. 19. Thus, a stack is grown 110 on the semiconductor substrate, the drain region 12 is grown 141 on the semiconductor substrate, the channel region 21 is grown on the drain region 12 and the source region 22 is grown on the channel region 21. Thus, this first process step may comprise the blanket epi-growth of a p-i-n stack, the result of which is illustrated in FIG. 14. The stack is etched 120 to form a fin structure on the semiconductor substrate, as illustrated in FIG. 15. The semiconductor substrate and a lower portion of the fin are protected 131 with an isolation mask 71 such that the source region 22 and a portion of the channel region 21 remain exposed, as illustrated by FIG. 16 and FIG. 17. Then, the pocket layer 31 is grown 132 on the source region 22 and on the exposed portion of the channel region 21, as shown in FIG. 18. Next, the gate dielectric 32 is deposited 133 on the pocket layer 31, as shown in FIG. 19.

Figure 28:
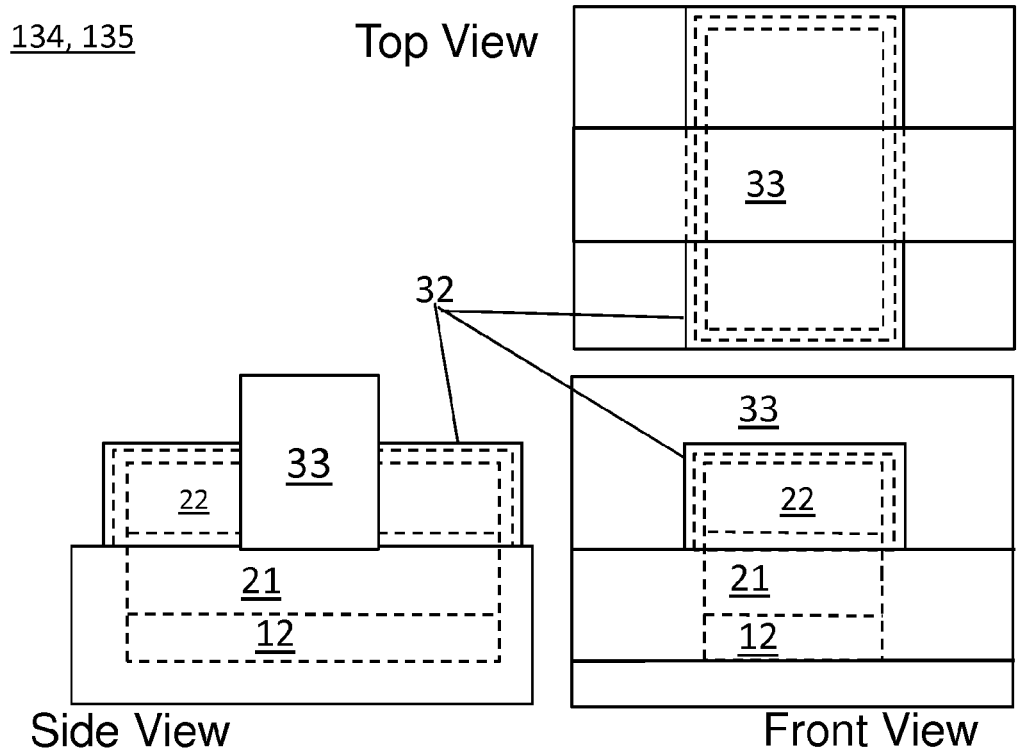
FIG. 28 shows the result of depositing the gate electrode on the gate dielectric layer and patterning the gate electrode in a second exemplary method according to an embodiment.

However, the second exemplary method then proceeds by depositing 134 the gate electrode 33 on the gate dielectric layer 32 and patterning 135 the gate electrode 33 such as to remove the gate electrode material 33 overlaying the source region 22 outside the gate interface portion, as shown by FIG. 28.

In a method according to some embodiments, providing of the gate structure may be adapted such that the gate interface portion of the source region 22 is spaced away from the end portions of the source region 22 with respect a longitudinal direction along which the fin structure extends over the semiconductor substrate. For example, in a method according to some embodiments, providing of the gate structure may be adapted such the gate interface portion of the source region 22 comprises a central portion of the source region 22 with respect to a longitudinal direction along which the fin structure extends over the semiconductor substrate, and in which the gate interface portion does not comprise an end portion of the source region 22 with respect to this longitudinal direction. The patterning applied to the gate electrode 33 in the second exemplary method, depicted in FIG. 28, is an example of such method in which the gate structure is spaced away from the ends of the source region 22 in the longitudinal direction.

Figure 29:
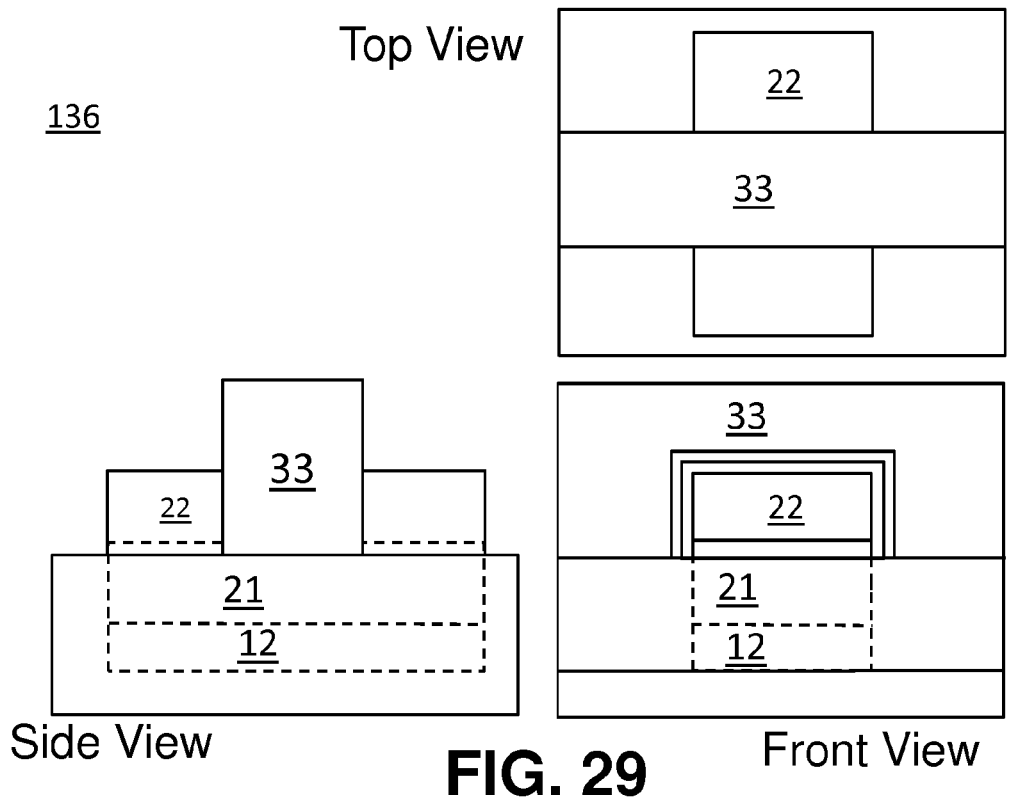
FIG. 29 shows the intermediate product after etching away the gate dielectric layer and the pocket layer using the gate electrode as mask in a second exemplary method according to an embodiment.

Then, the second exemplary method again proceeds further along similar lines as the first exemplary method. FIG. 29 shows the intermediate product after the next step of etching 136 away the gate dielectric layer 32 and the pocket layer 31 using the gate electrode 33 as mask.

Figure 30:
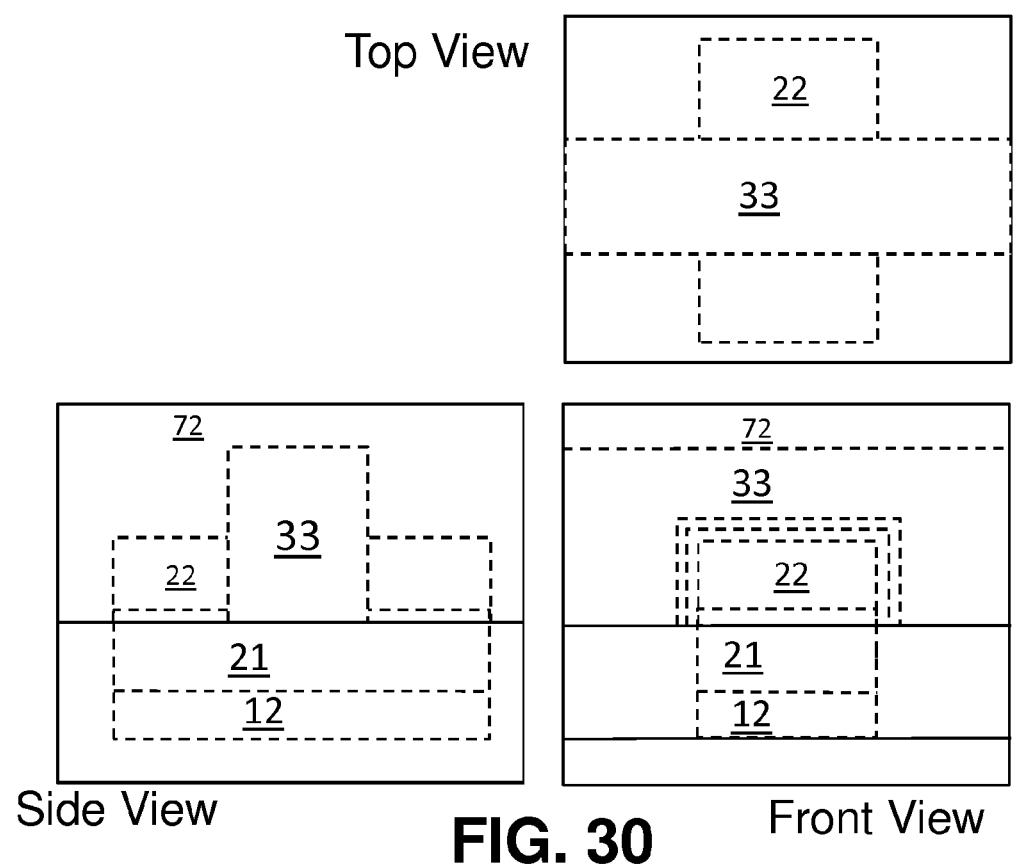
FIG. 30 illustrates the product after deposition of a nitride hard mask and the patterning of this mask to expose the drain region for etching in a second exemplary method according to an embodiment.
Figure 31:
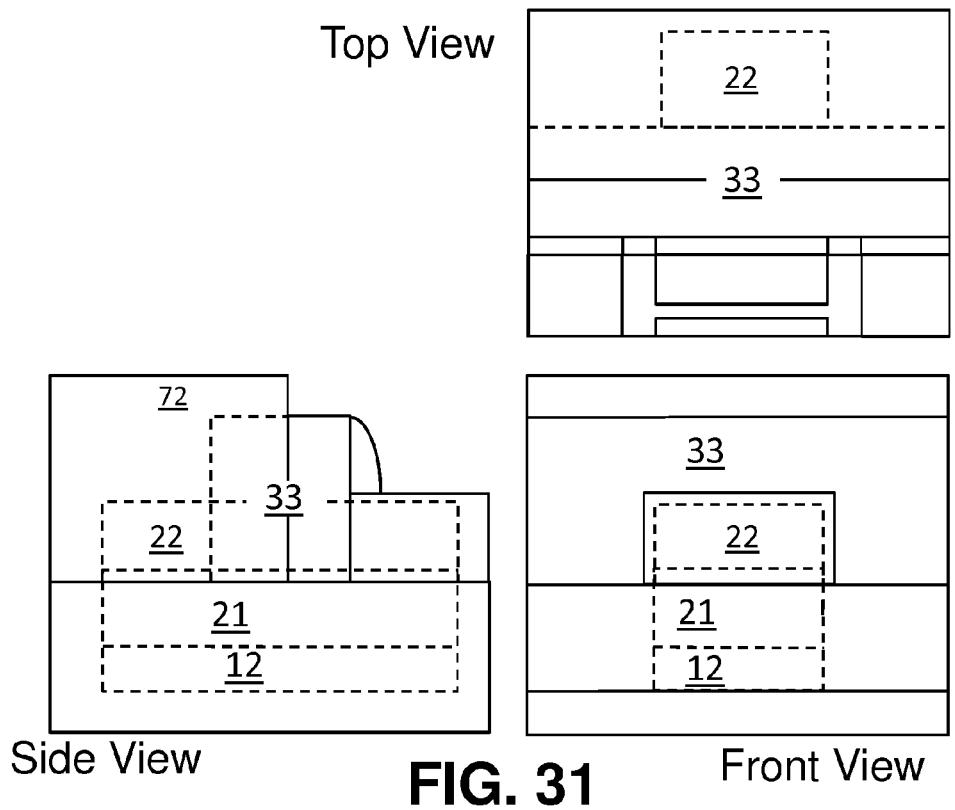
FIG. 31 shows the intermediate product after selectively etching away the gate dielectric, source region and the channel region on the drain side to expose the drain region in a second exemplary method according to an embodiment.
Figure 32:
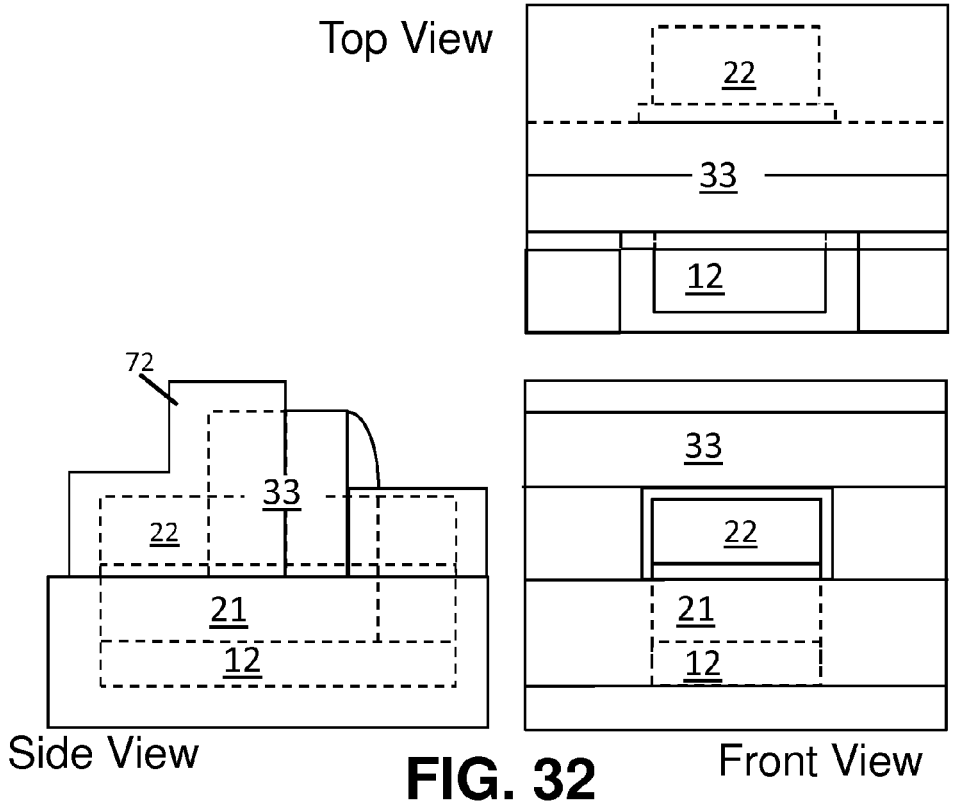
FIG. 32 shows the result after stripping of the nitride hard mask in a second exemplary method according to an embodiment.
Figure 33:
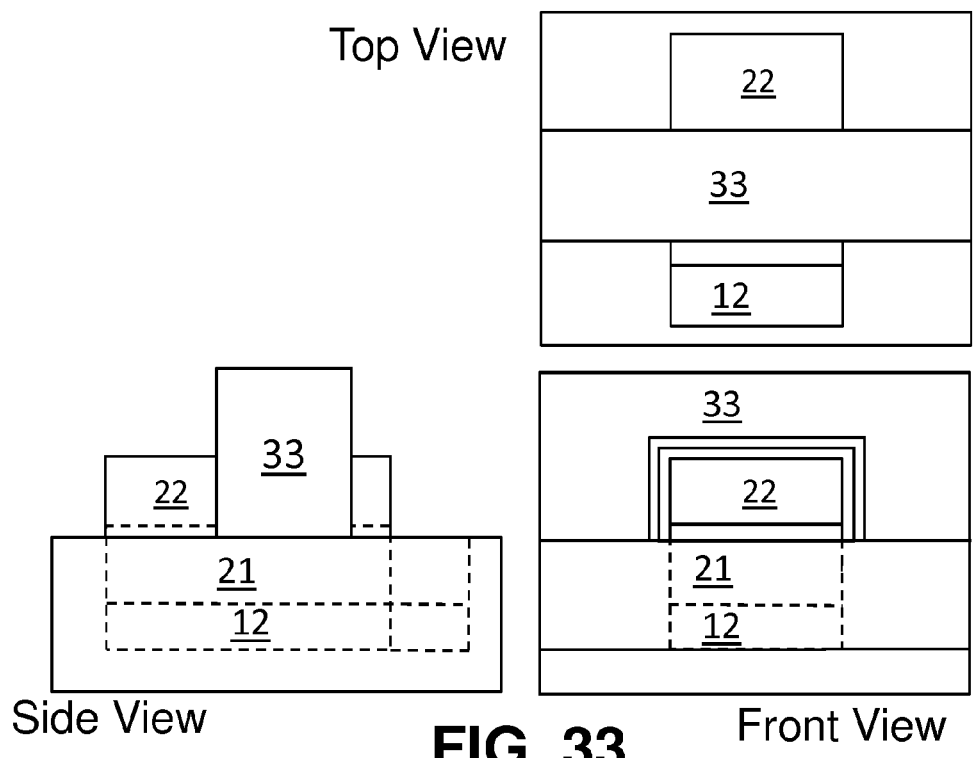
FIG. 33 shows the result after etching the nitride hard mask in a second exemplary method according to an embodiment.
Figure 34:
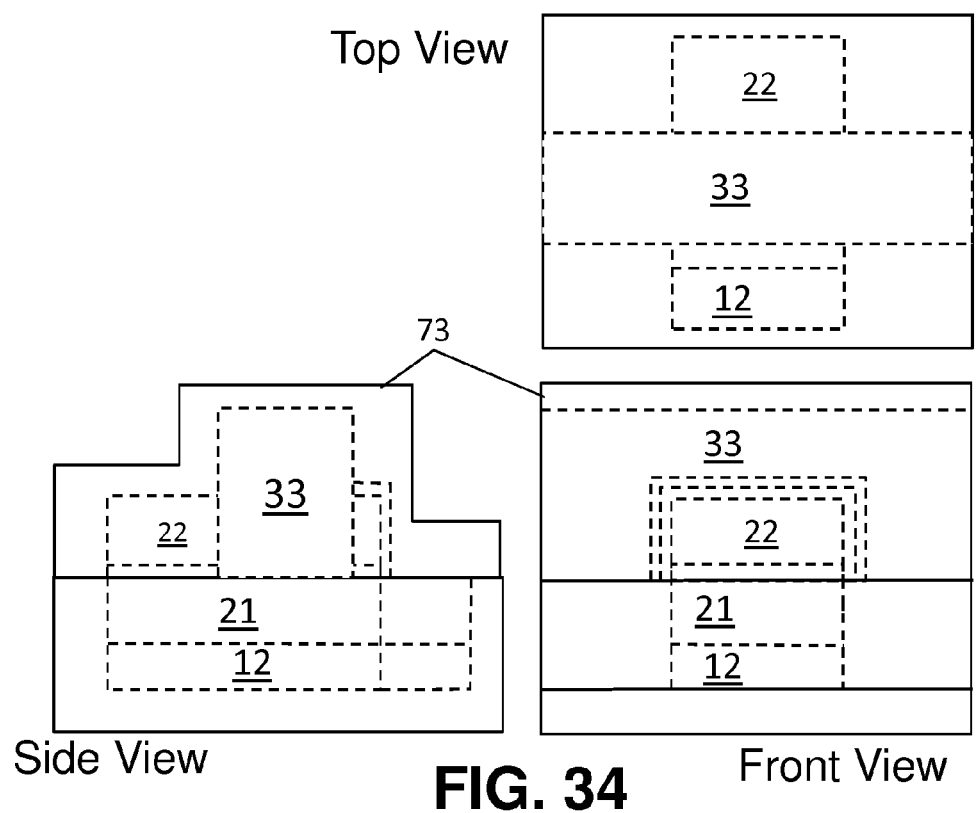
FIG. 34 shows the result after depositing a thin layer of nitride to form spacers in a second exemplary method according to an embodiment.
Figure 35:
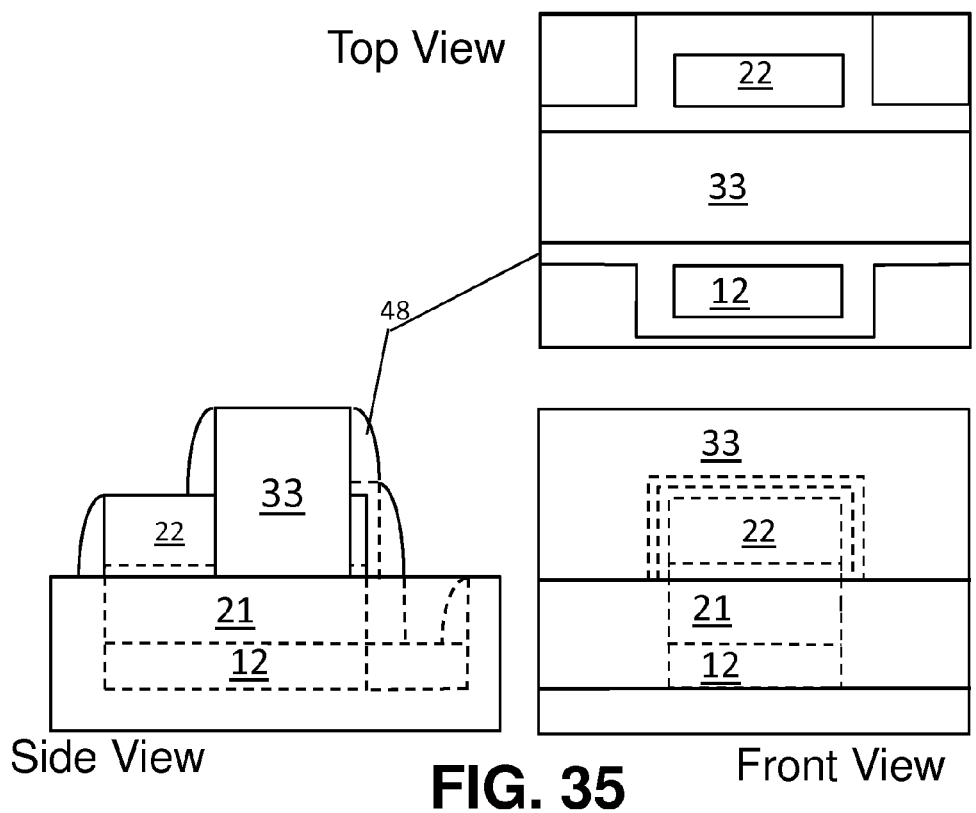
FIG. 35 shows the result after forming contact spacers in a second exemplary method according to an embodiment.

FIG. 30 illustrates the product after the deposition of a nitride hard mask 72. Then, as shown in FIG. 31, the nitride mask 72 may be patterned to expose the drain region 12 for etching. The source region 22 and the channel region 21, e.g. the intrinsic region 21, may then be etched to expose the drain region 12, as shown in FIG. 32. FIG. 33 shows the result after stripping of the nitride mask 72. In a next step, a thin layer of nitride 73 may be deposited, as shown in FIG. 34. Then, this nitride 73 may be etched to form contact spacers 48, as illustrated by FIG. 35. In a final step, the drain region 12, source region 22 and gate electrode 33 may be metalized where left exposed by the contact spacers 48.

The third exemplary method also proceeds generally along the same steps of the first exemplary method. Here, a stack is grown 110 on the semiconductor substrate, by growing the drain region 12 on the semiconductor substrate, the channel region 21 on the drain region 12 and the source region 22 on the channel region 21.

Figure 36:
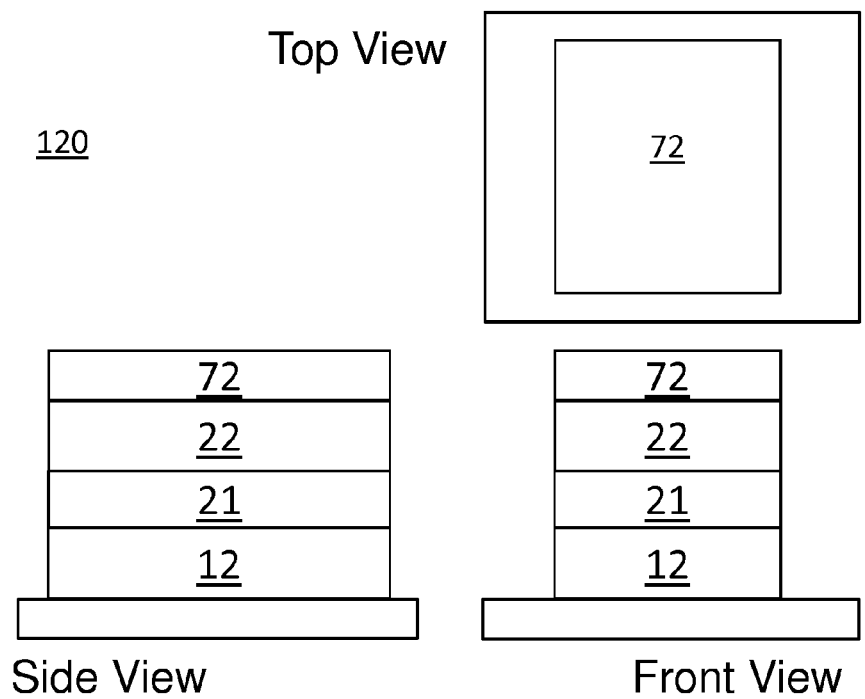
FIG. 36 shows the result after etching a stack to form a fin structure on the semiconductor substrate in a third exemplary method according to an embodiment.

Next, a hard mask 72 may be used for etching of the fin structure, e.g. a hard mask layer 72 is provided on top of the source region 22 and the stack is then etched 120 to form a fin structure on the semiconductor substrate, as illustrated in FIG. 36. However, in this exemplary embodiment, the hard mask layer 72 is preferably not removed immediately after etching the fin structure, since it can be advantageously used for preventing the formation of the gate on the top surface of the fin structure, which is further discussed hereinbelow. Alternatively, the method may start from a p-i-n or n-i-p stack without hard mask 72, an etching step is performed to form the fin structure, and then a hard mask 72 is provided on top of the source region 22.

Figure 37:
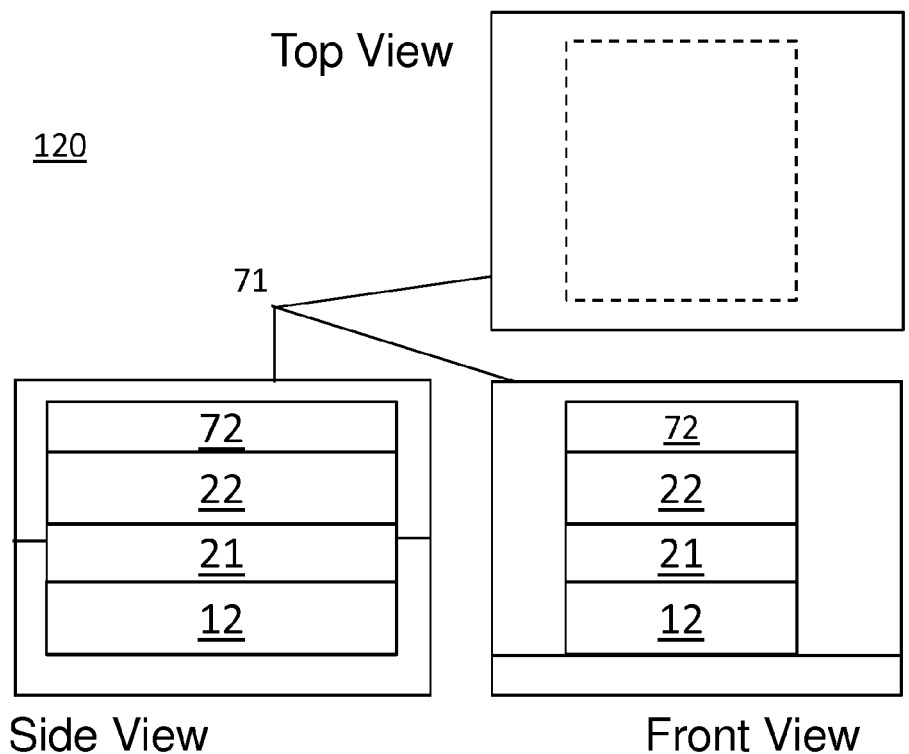
FIG. 37 shows the result after filling with a fill oxide in a third exemplary method according to an embodiment.
Figure 38:
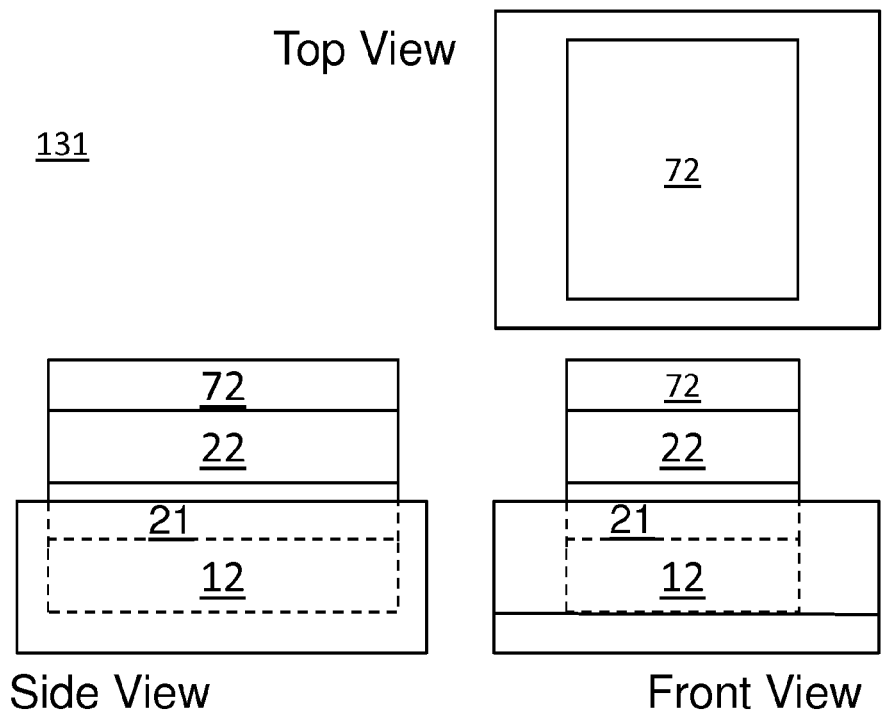
FIG. 38 shows the source region and a portion of the channel region remaining exposed after etching the fill oxide in a third exemplary method according to an embodiment.
Figure 39:
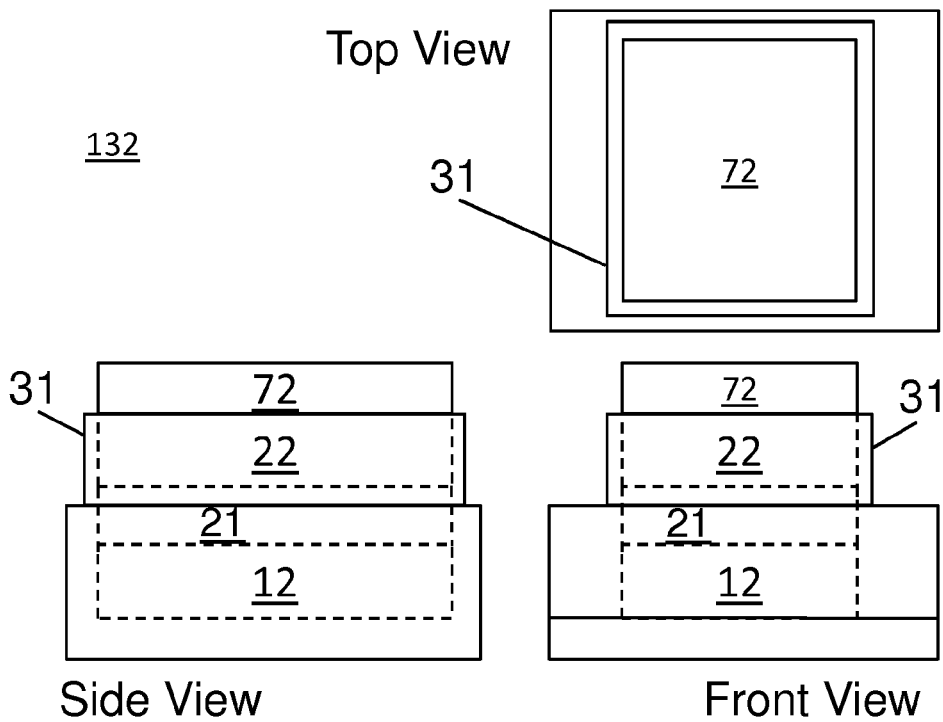
FIG. 39 shows the pocket layer grown on the source region and the exposed portion of the channel region in a third exemplary method according to an embodiment.
Figure 40:
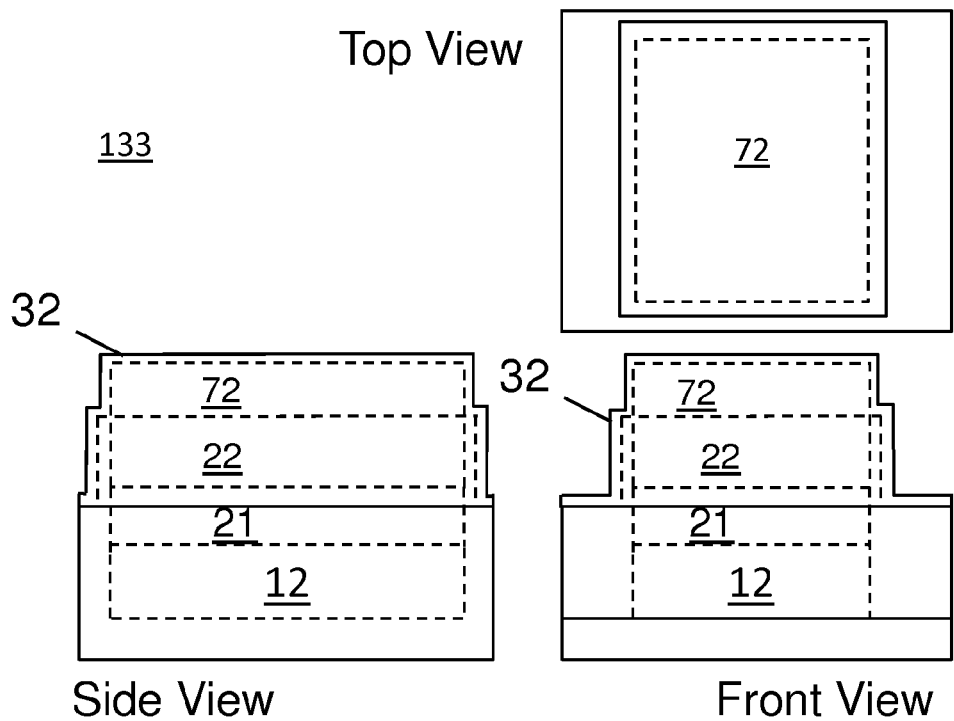
FIG. 40 shows the intermediate result after depositing the gate dielectric on the pocket layer and the hard mask in a third exemplary method according to an embodiment.

The semiconductor substrate and a lower portion of the fin is protected 131 with an isolation mask 71 such that the hard mask 72, the source region 22 and a portion of the channel region 21 remain exposed, as illustrated by FIG. 37 and FIG. 38. Then, the pocket layer 31 is grown 132 on the source region 22 and the exposed portion of the channel region 21, as shown in FIG. 39. Next, the gate dielectric 32 is deposited 133 on the pocket layer 31 and the hard mask 72, as shown in FIG. 40.

Figure 41:
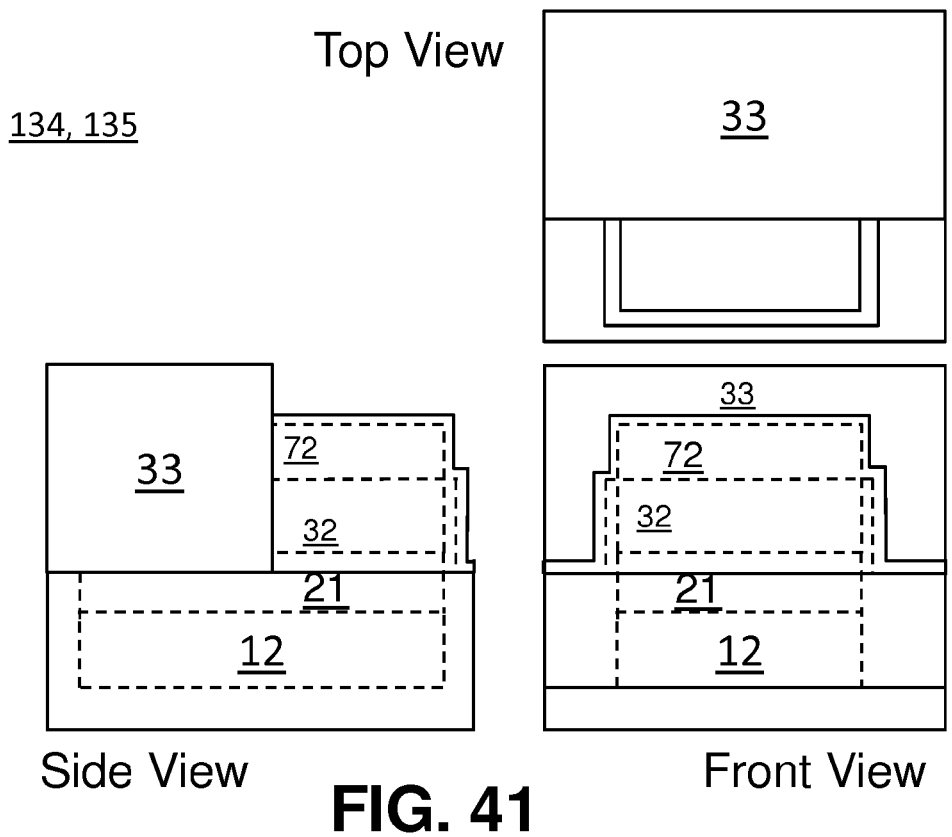
FIG. 41 shows the result after depositing and patterning the gate electrode in a third exemplary method according to an embodiment.

Next, the gate electrode 33 is deposited 134 on the gate dielectric layer 32 and the gate electrode 33 is patterned 135 such as to remove the gate electrode material 33 overlaying the source region 22 outside the gate interface portion, as shown by FIG. 41.

In this exemplary method, providing of the gate structure may be adapted such that the gate interface portion of the source region 22 comprises an end portion of the source region 22.

Figure 42:
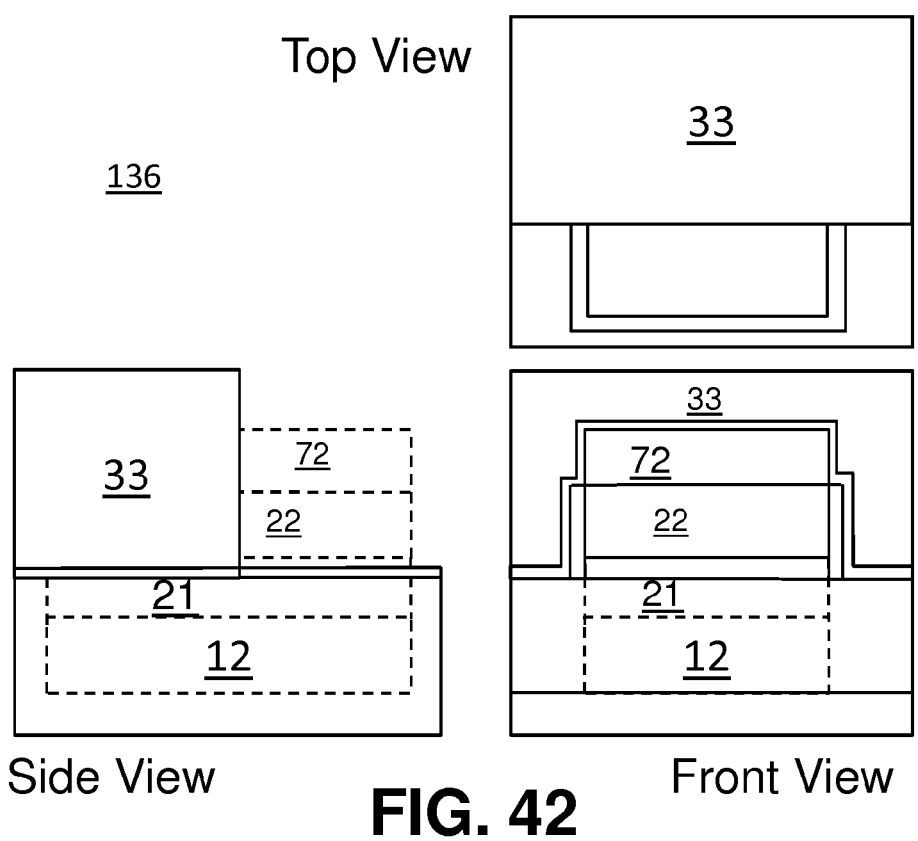
FIG. 42 shows the intermediate product after etching away the gate dielectric layer and the pocket layer using the gate electrode as mask in a third exemplary method according to an embodiment.

FIG. 42 shows the intermediate product after the next step of etching 136 away the gate dielectric layer 32 and the pocket layer 31 using the gate electrode 33 as mask.

Figure 43:
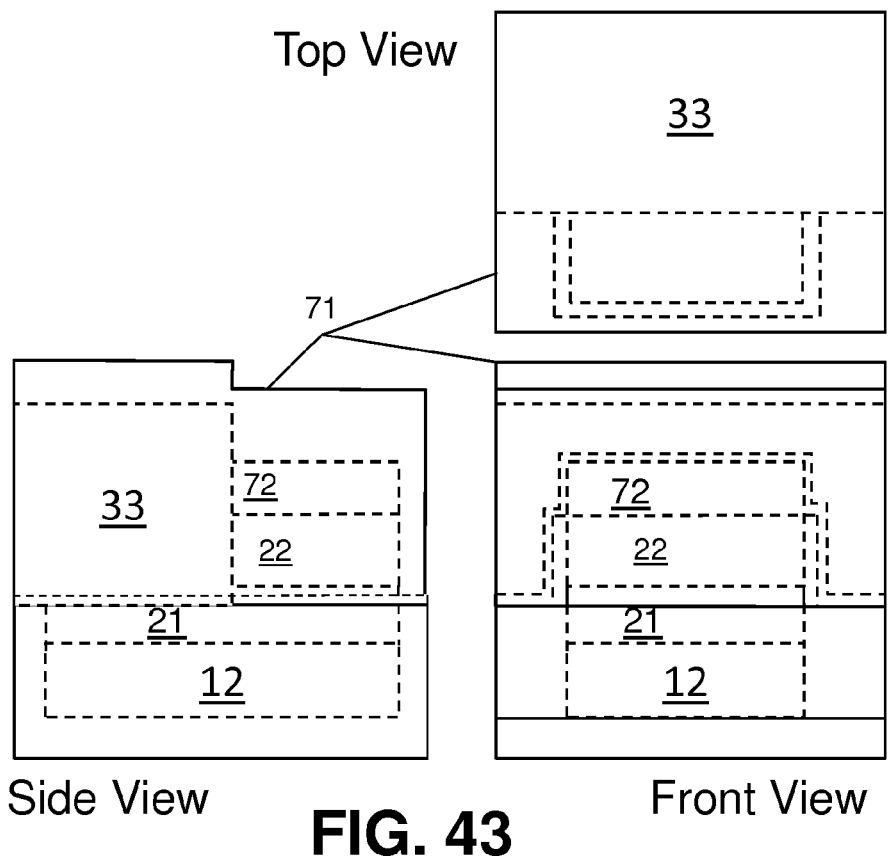
FIG. 43 illustrates the product after the deposition of an oxide mask in a third exemplary method according to an embodiment.
Figure 44:
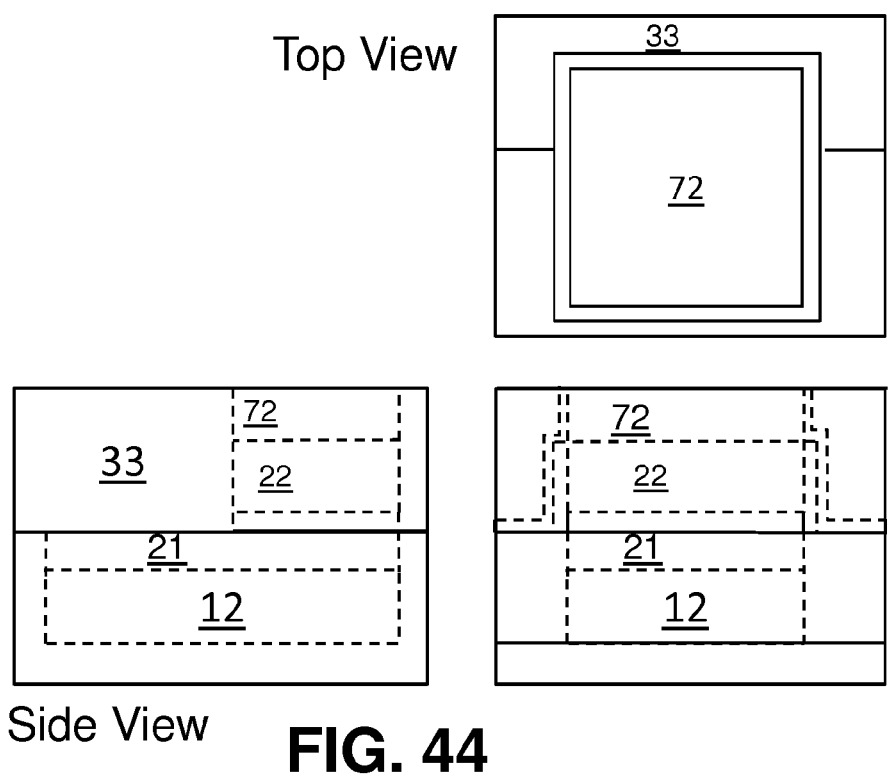
FIG. 44 shows the intermediate product after chemo-mechanical polishing, in a third exemplary method according to an embodiment.

FIG. 43 illustrates the product after the deposition of an oxide mask 71. Then, as shown in FIG. 44, a polishing technique, e.g. chemo-mechanical polishing, may be applied until the nitride mask 44 is exposed.

Figure 45:
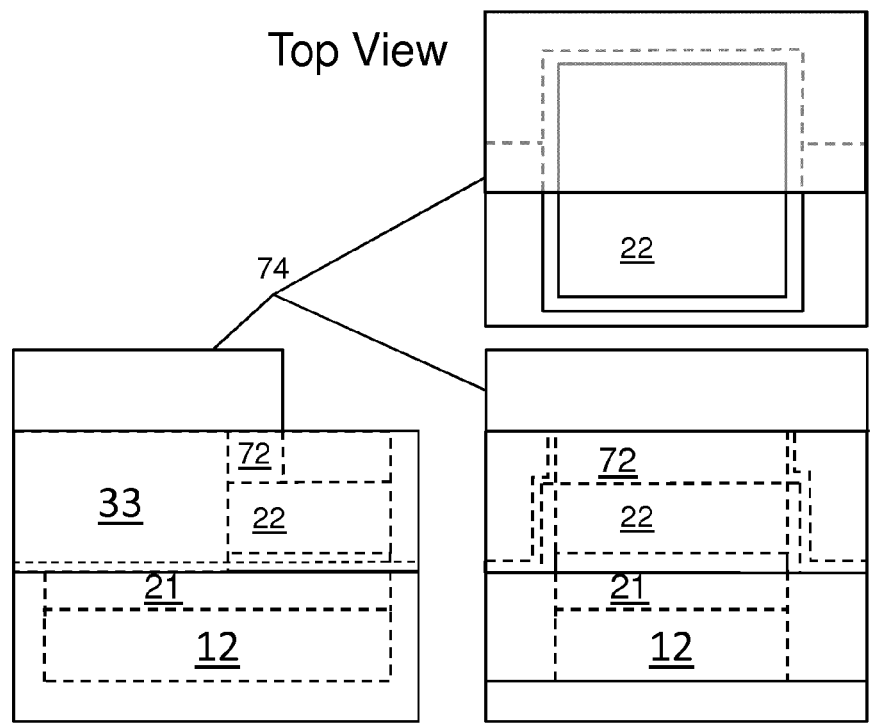
FIG. 45 shows the result after depositing and patterning a gate protection hard mask in a third exemplary method according to an embodiment.
Figure 46:
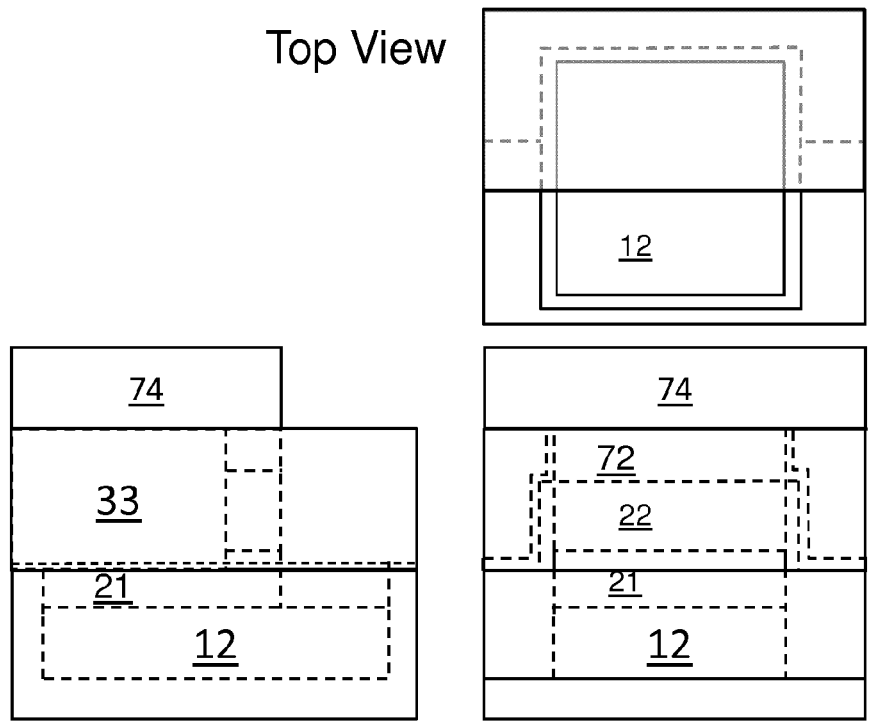
FIG. 46 shows the drain region partially exposed after etching of the source region and the channel region in a third exemplary method according to an embodiment.

Then, as shown in FIG. 45, a gate protection hard mask 74 may be deposited and patterned to open a window over the drain region 12, e.g. a gate protection nitride mask 74 may be patterned to expose the drain region 12 for etching. Furthermore, the fin etch hard mask 72 may be etched out to expose the source region 22. Then, as shown in FIG. 46, the source region 22 and the channel region 21 may be etched to expose the drain region 12.

Figure 47:
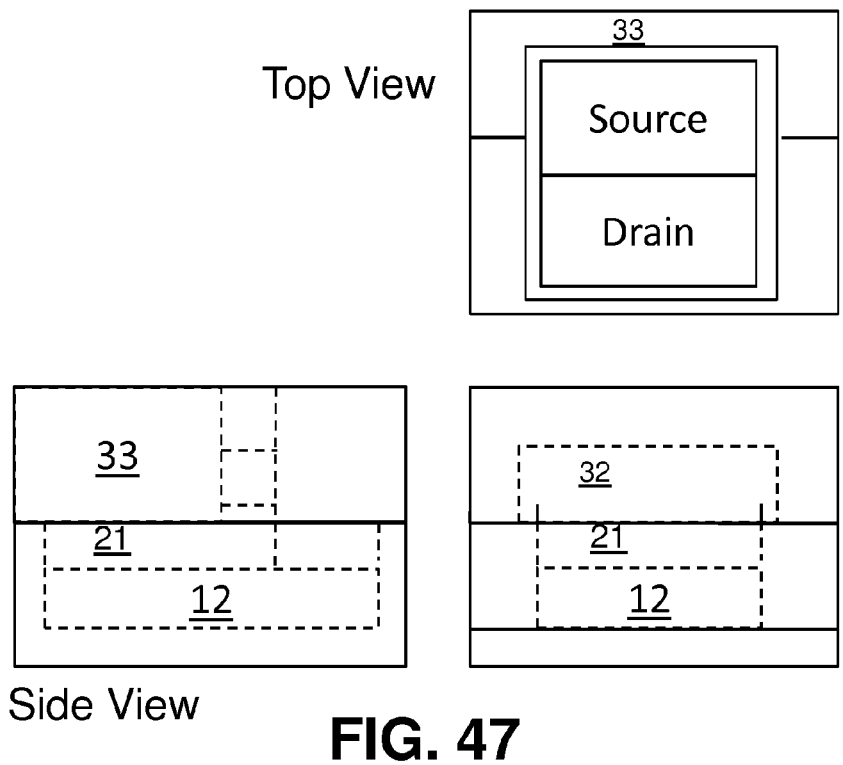
FIG. 47 shows the result after removal of the gate protection hard mask and the fin etch hard mask in a third exemplary method according to an embodiment.

Then, the gate protection hard mask 74 and the fin etch hard mask 72 may be removed, as shown in FIG. 47, e.g. the nitride masks may be stripped.

Figure 48:
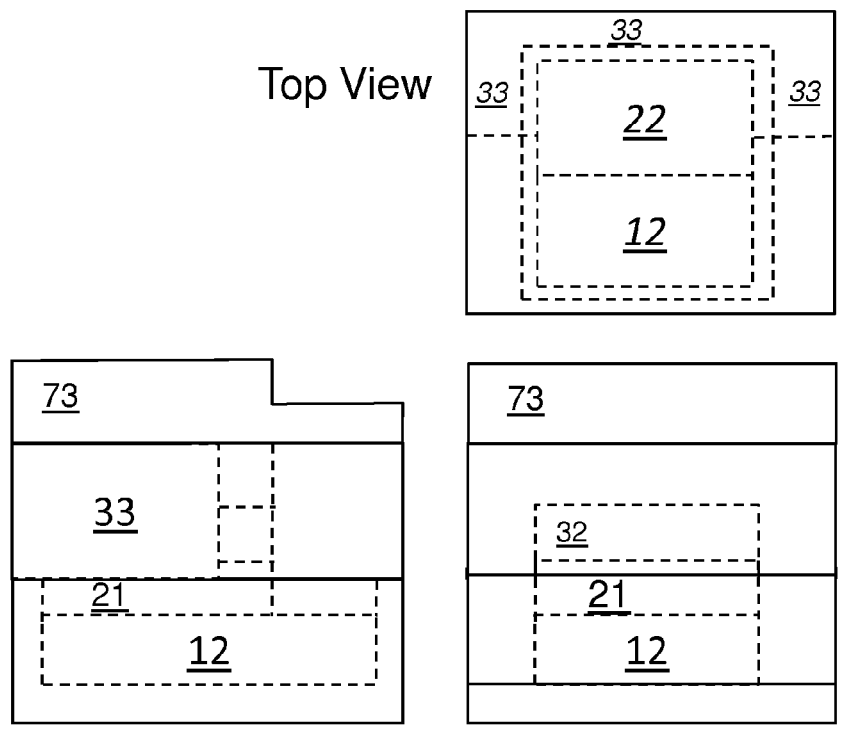
FIG. 48 shows the result after depositing a thin layer of nitride for spacer formation in a third exemplary method according to an embodiment.

In a next step, a thin layer of nitride 73 may be deposited, as shown in FIG. 48. Then, this nitride 73 may be etched to form spacers 48, and the exposed surfaces of the drain region 12, source region 22 and gate electrode 33 may be metalized.

Thus, as illustrated by this third exemplary method, in a method according to some embodiments, growing the stack on the semiconductor substrate may comprise providing a hard mask layer 72 over the source region 22, polishing the fin structure to expose the hard mask layer 72 after depositing the gate electrode 33 and removing the hard mask layer 72 to expose a source contact for providing an electrical interface to the source region 22, such that the source contact is at least partially surrounded by the gate electrode 33.

Figure 49:
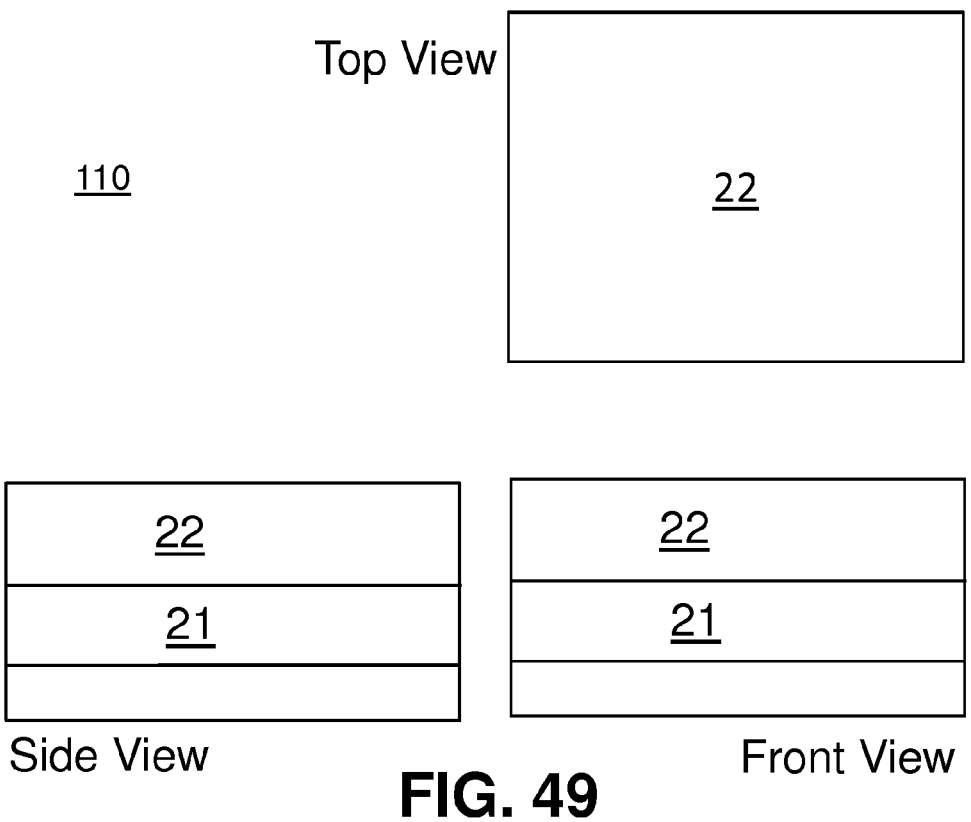
FIG. 49 shows the result of growing a stack on a semiconductor substrate in a fourth exemplary method according to an embodiment.
Figure 50:
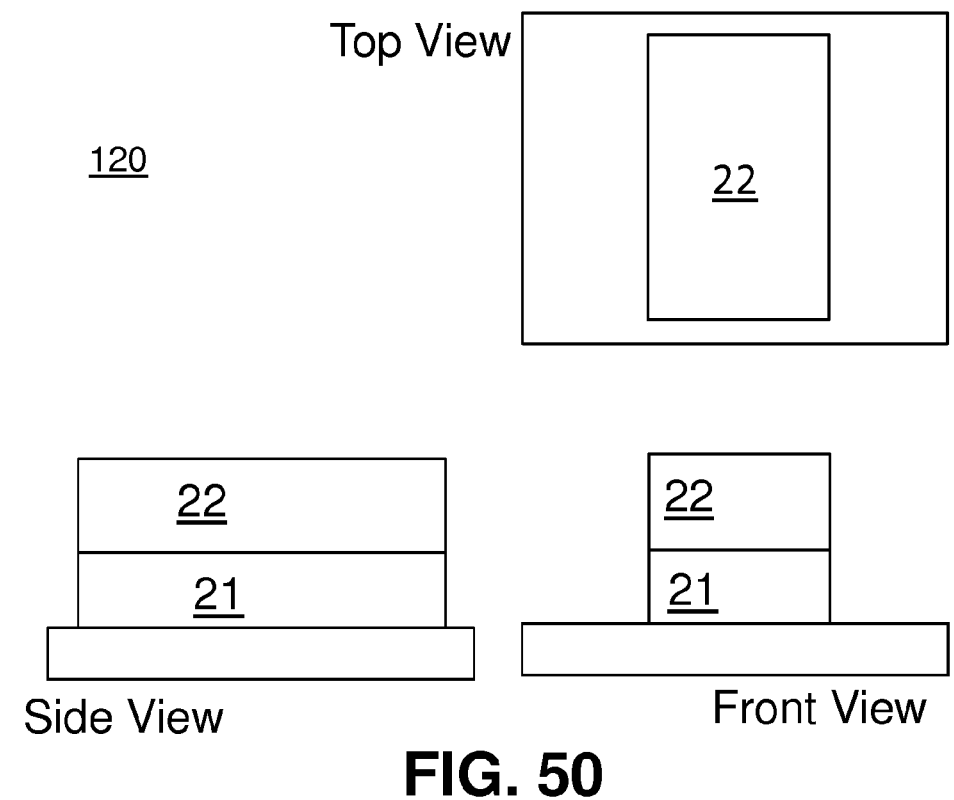
FIG. 50 shows the result after etching the stack to form a fin structure in a fourth exemplary method according to an embodiment.
Figure 51:
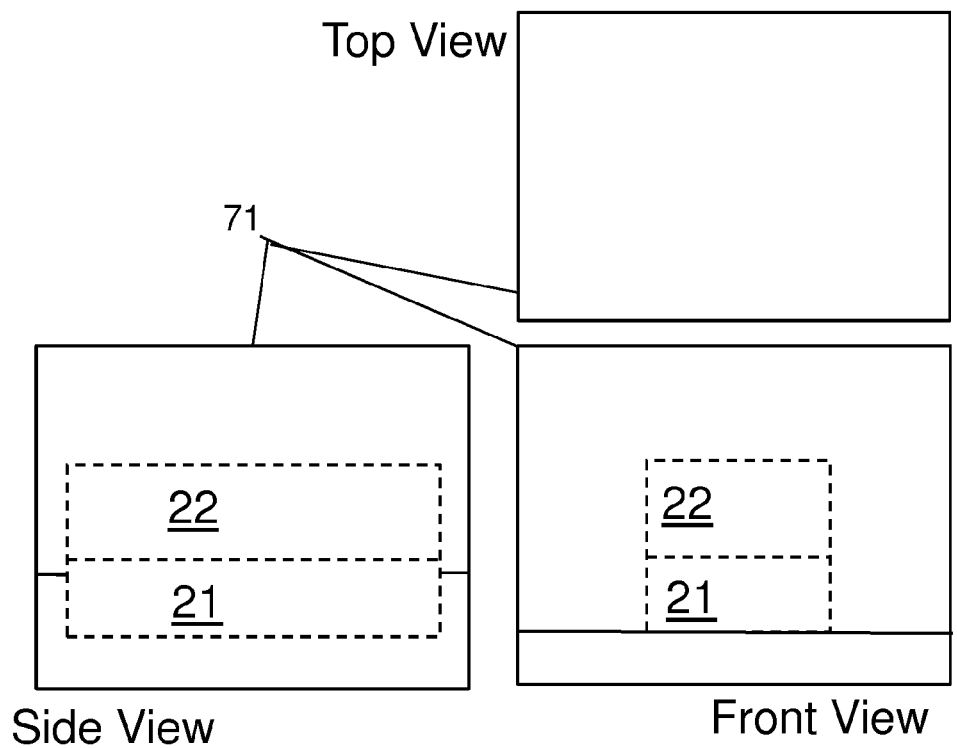
FIG. 51 shows the result after applying a fill oxide as to the fin structure in a fourth exemplary method according to an embodiment.
Figure 52:
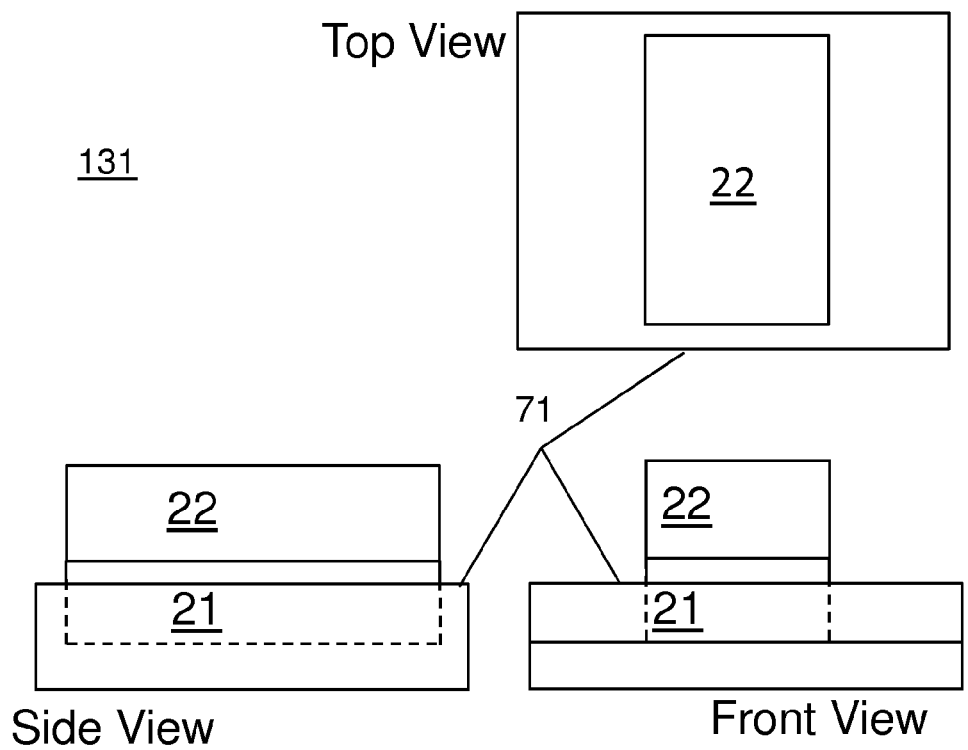
FIG. 52 shows the result after protecting the semiconductor substrate and a lower portion of the fin with an isolation mask formed by etching this fill oxide in a fourth exemplary method according to an embodiment.
Figure 53:
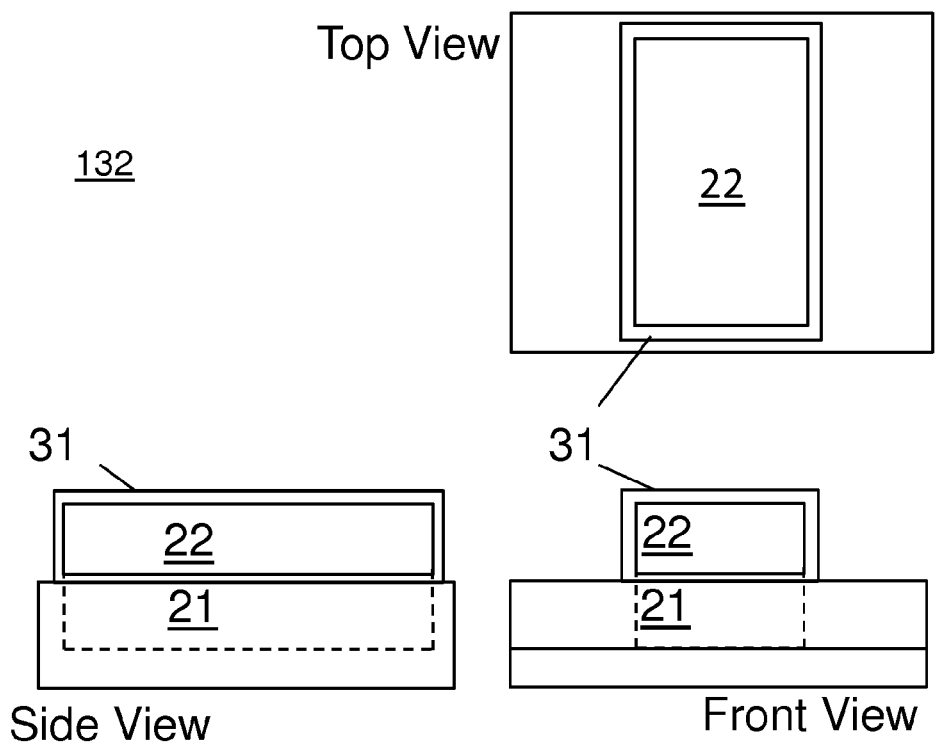
FIG. 53 shows the result after growing the pocket layer on the source region and on the exposed portion of the channel region in a fourth exemplary method according to an embodiment.
Figure 54:
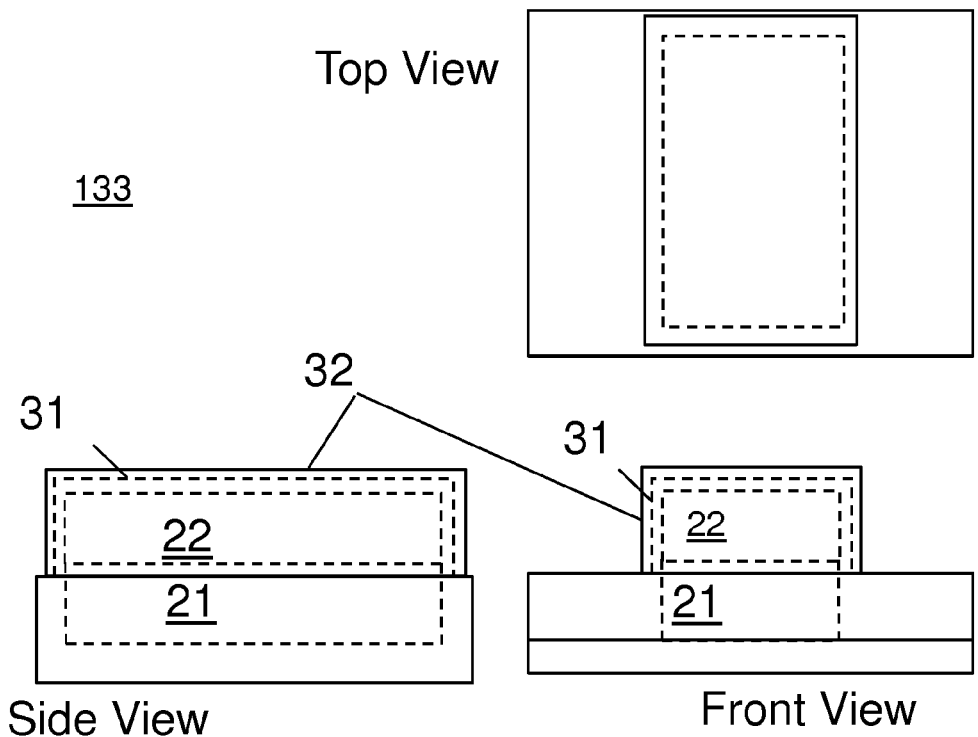
FIG. 54 shows the result after depositing a gate dielectric on the pocket layer in a fourth exemplary method according to an embodiment.

The fourth exemplary method comprises growing 110 a stack on the semiconductor substrate. The channel region 21 is grown on substrate, and the source region 22 is grown on the channel region 21. The result of this first step is illustrated in FIG. 49. The stack is etched 120 to form a fin structure on the semiconductor substrate, as illustrated in FIG. 50. The semiconductor substrate and a lower portion of the fin are then protected 131 with an isolation mask 71 such that the source region 22 and a portion of the channel region 21 remain exposed, as illustrated by FIG. 51 and FIG. 52. Then, the pocket layer 31 is grown 132 on the source region 22 and on the exposed portion of the channel region 71, as shown in FIG. 53. Next, the gate dielectric 32 is deposited 133 on the pocket layer 31, as shown in FIG. 54.

Figure 55:
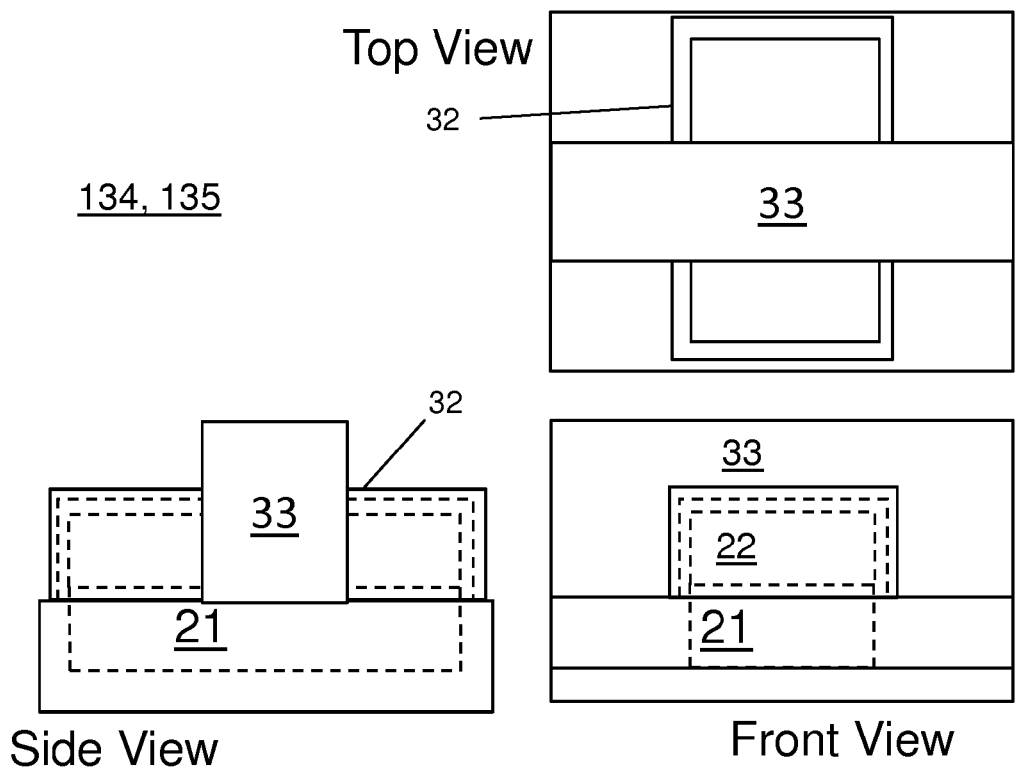
FIG. 55 shows the result of depositing and patterning the gate electrode on the gate dielectric layer in a fourth exemplary method according to an embodiment.

The fourth exemplary method may then proceed by depositing 134 the gate electrode 33 on the gate dielectric layer 32 and patterning 135 the gate electrode 33 such as to remove the gate electrode material 33 overlaying the source region 22 outside the gate interface portion, as shown by FIG. 55. The gate interface portion of the source region 22 may be spaced away from the end portions of the source region 22 with respect a longitudinal direction along which the fin structure extends over the semiconductor substrate.

Figure 56:
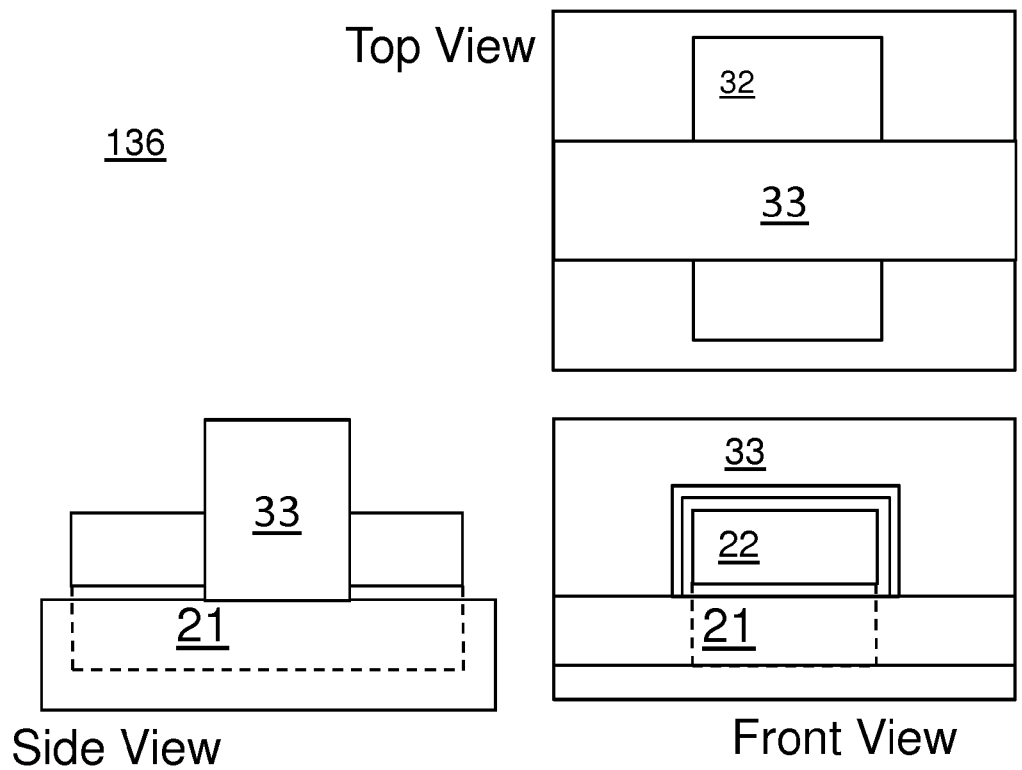
FIG. 56 shows the intermediate product after etching away the gate dielectric layer and the pocket layer using the gate electrode as mask in a fourth exemplary method according to an embodiment.

FIG. 56 shows the intermediate product after the next step of etching 136 away the gate dielectric layer 32 and the pocket layer 31 using the gate electrode 33 as mask.

Figure 57:
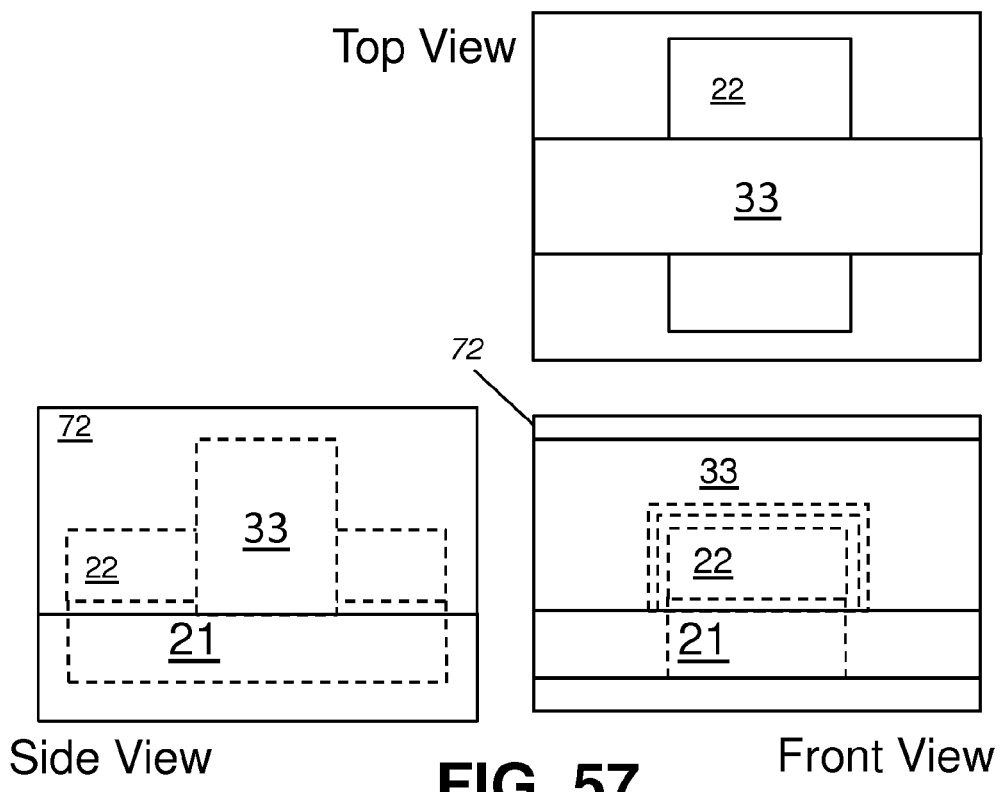
FIG. 57 illustrates the intermediate product after deposition of a nitride hard mask in a fourth exemplary method according to an embodiment.
Figure 58:
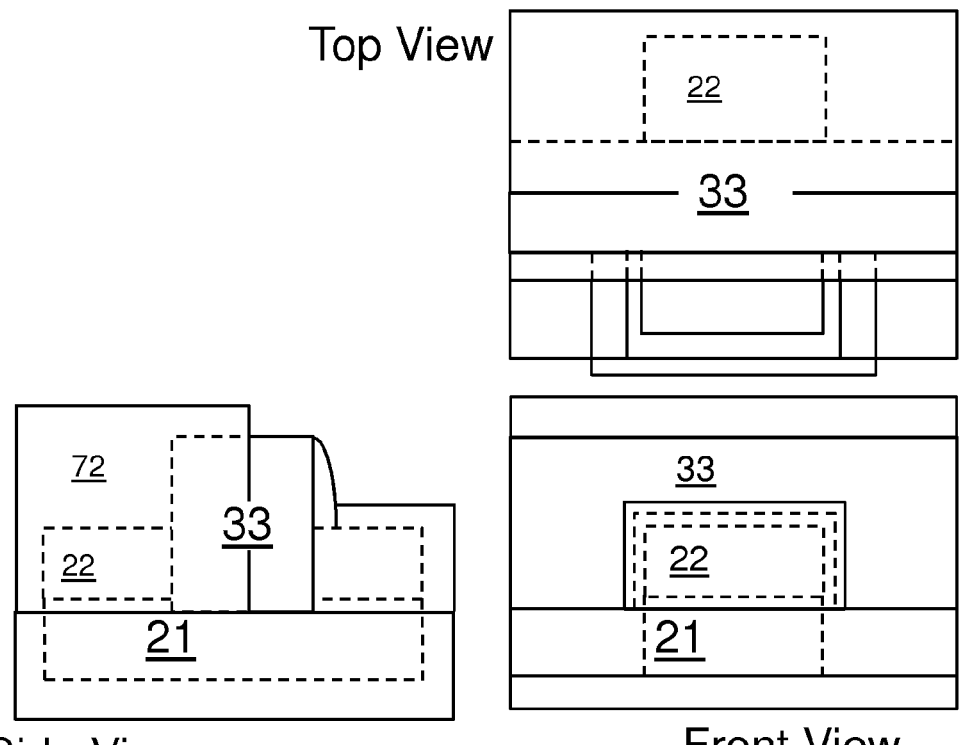
FIG. 58 shows the result after patterning the nitride mask to expose a portion of the channel region for growing a drain region thereon in a fourth exemplary method according to an embodiment.
Figure 59:
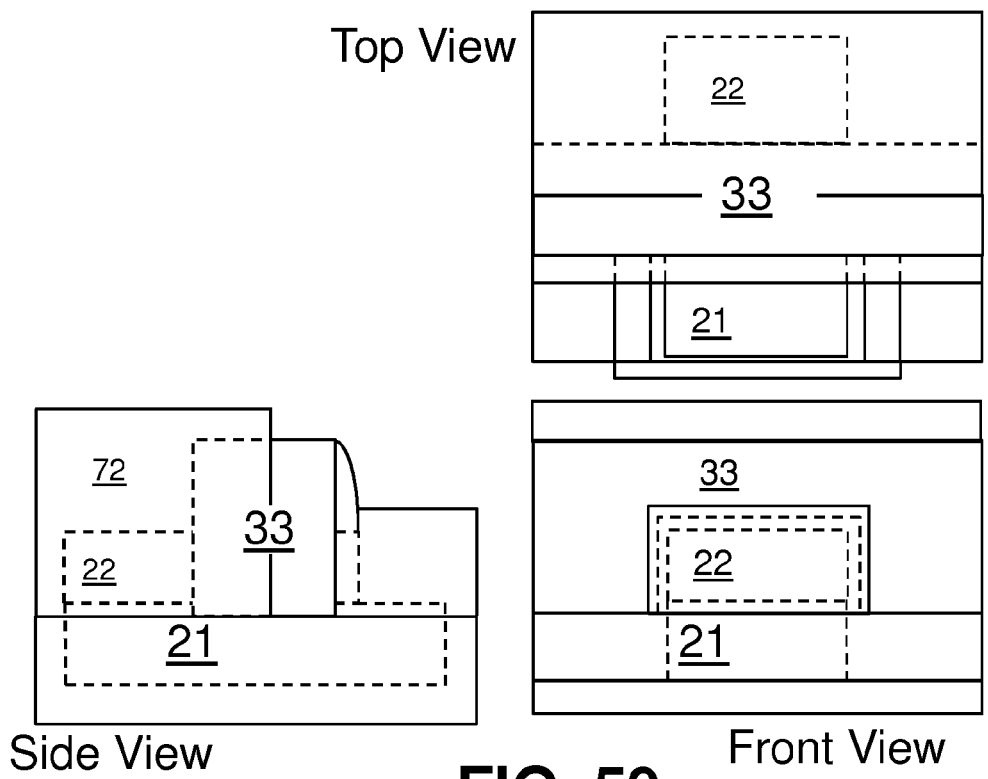
FIG. 59 shows the result after etching the source region to expose the channel region.
Figure 60:
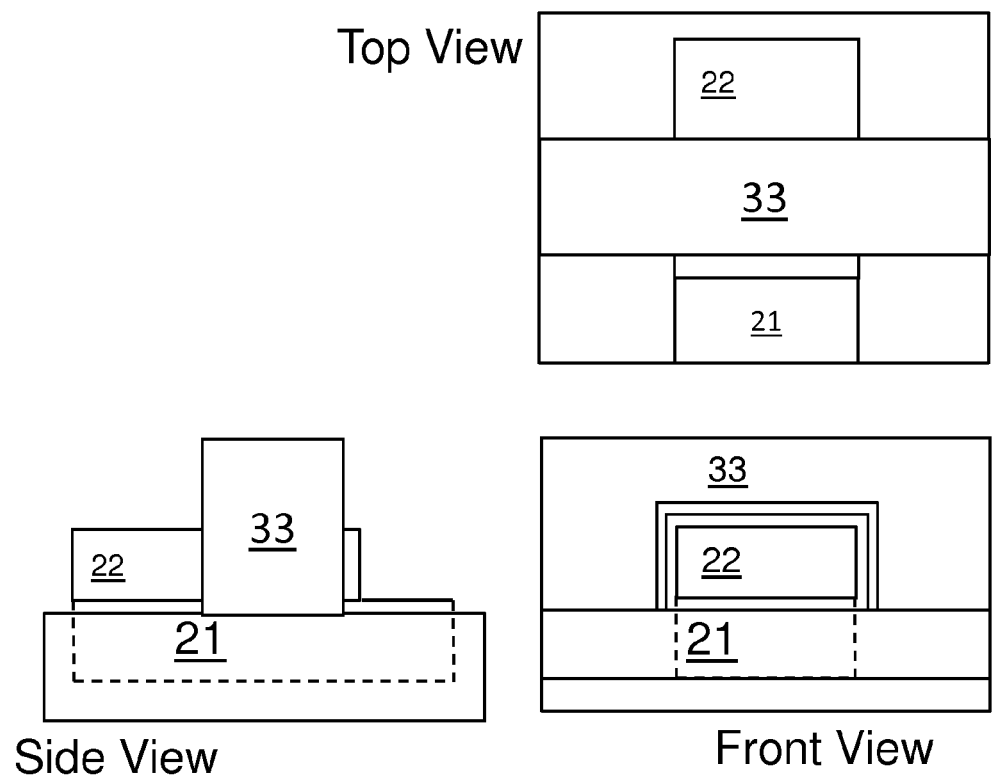
FIG. 60 shows the result after stripping of the nitride mask in a fourth exemplary method according to an embodiment.

FIG. 57 illustrates the product after the deposition of a nitride hard mask 72. Then, as shown in FIG. 58, the nitride mask 72 may be patterned to expose a portion for growing a drain region 12 on the channel region 21. The source region 22 may then be etched to expose the channel region 21, as shown in FIG. 59. FIG. 60 shows the result after stripping of the nitride mask 72.

Figure 61:
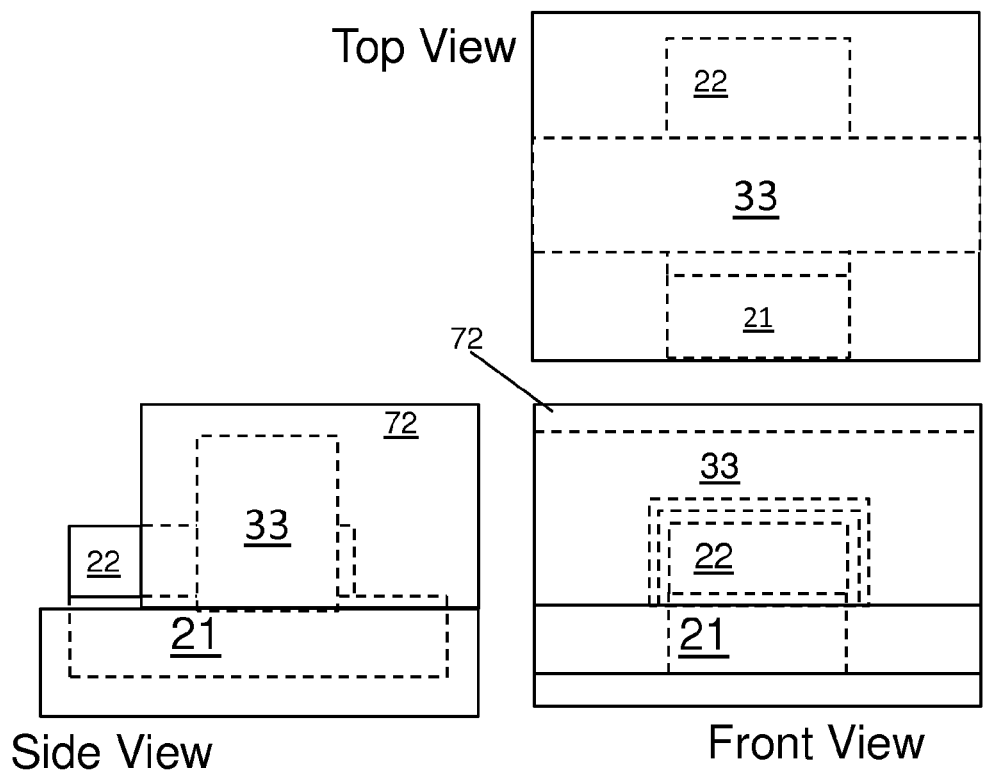
FIG. 61 shows the result after depositing a nitride to form a hard mask during drain growth in a fourth exemplary method according to an embodiment.
Figure 62:
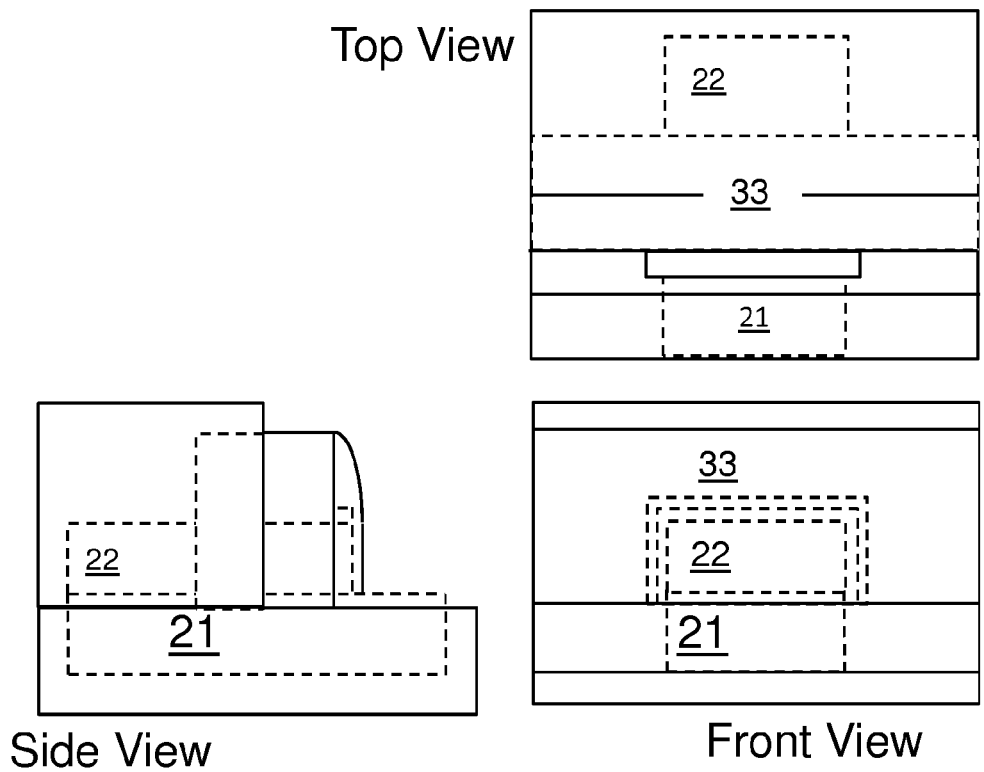
FIG. 62 shows the intermediate product after etching the nitride to form one-sided spacers in a fourth exemplary method according to an embodiment.
Figure 63:
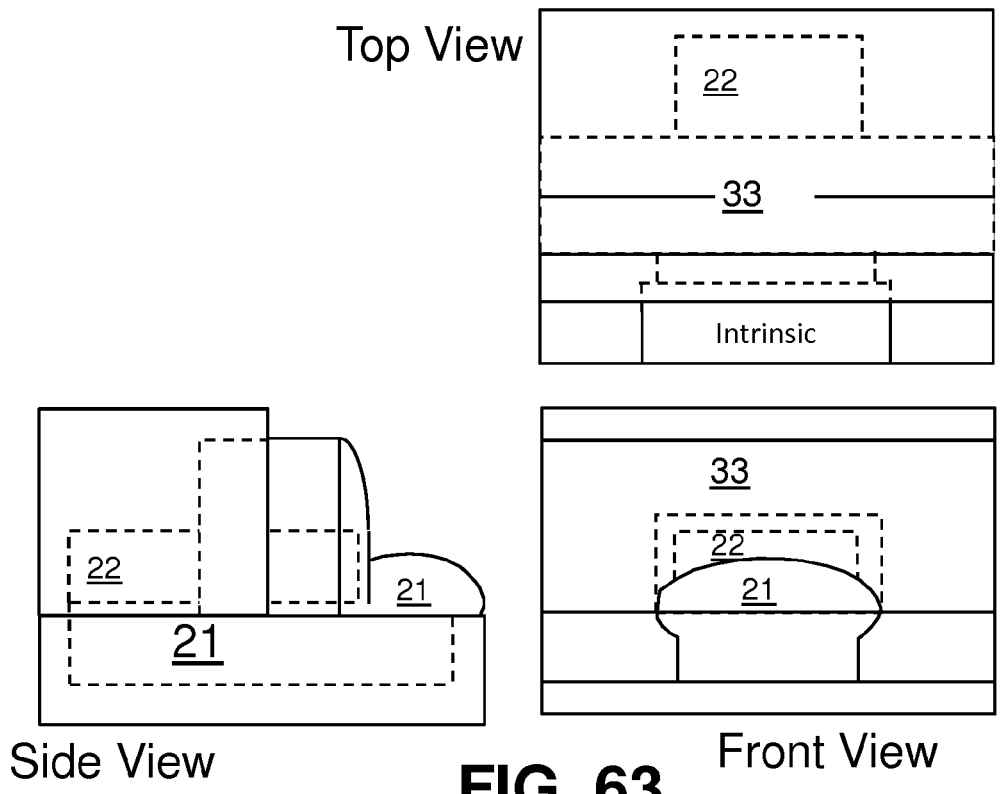
FIG. 63 shows the product after growing a further channel region on the exposed portion of the channel region in a fourth exemplary method according to an embodiment.
Figure 64:
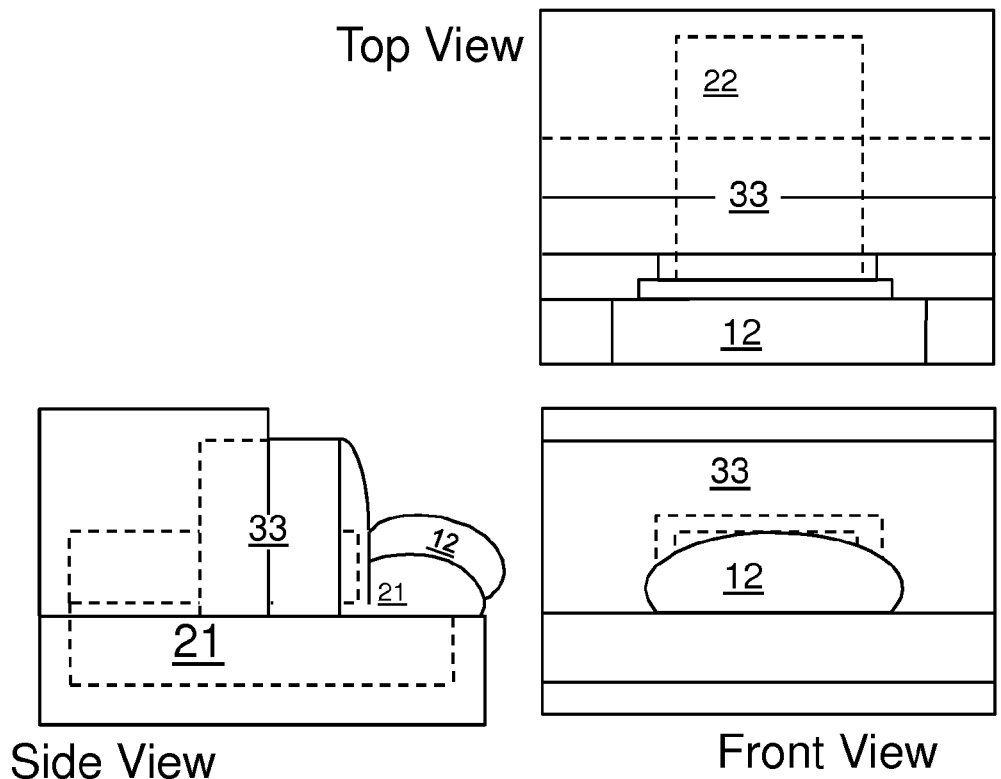
FIG. 64 shows the result after growing the drain region on the further channel region in a fourth exemplary method according to an embodiment.
Figure 65:
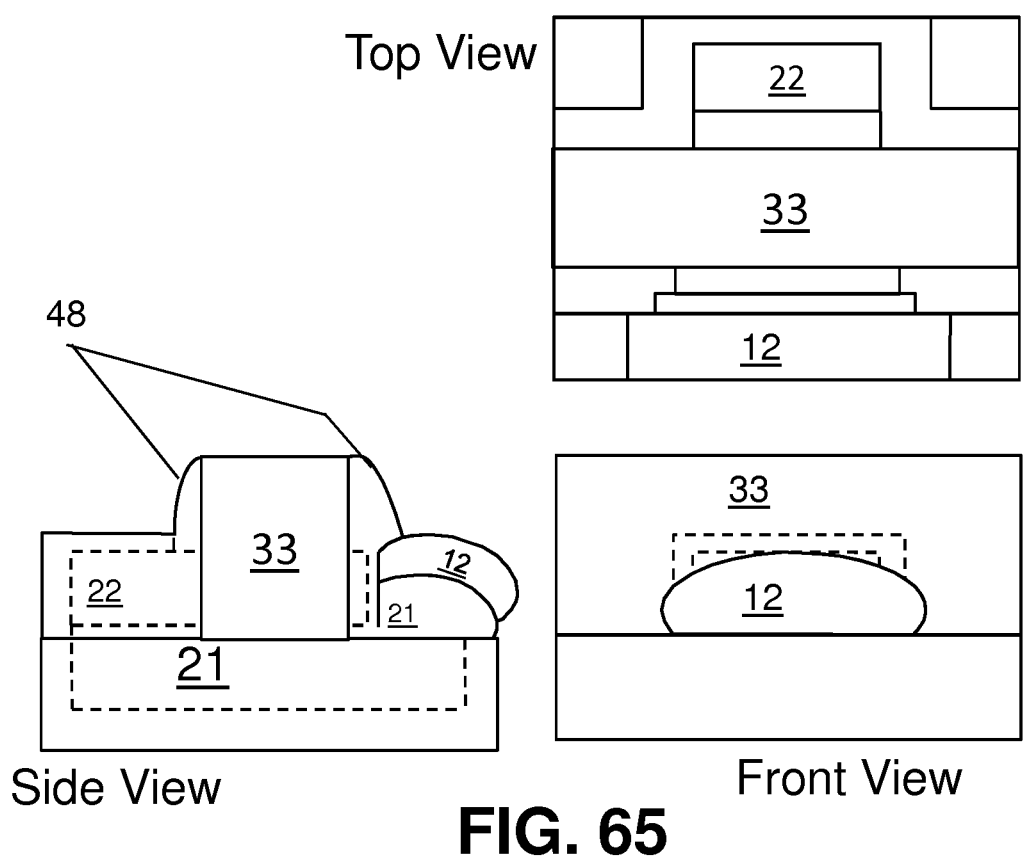
FIG. 65 shows the TFET device after forming spacers and metallizing of the source, gate and drain contacts in a fourth exemplary method according to an embodiment.

Then, nitride may be deposited to form a hard mask 72 during drain regrowth, as shown in FIG. 61. FIG. 62 shows the intermediate product after etching this nitride to form one-sided spacers 48. Then a further channel region 21 may be grown on the exposed portion of the channel region 21, as shown in FIG. 63. Thus, a large contact area in between the channel region 21 and the drain region 12 relative to the device volume and footprint can be achieved. Then, the drain region 12 may be grown on this further channel region 21, as illustrated in FIG. 64. Then, spacers 48 may be formed and metallization of the source, gate and drain contacts may be carried out, as shown in FIG. 65.

While the disclosure has been illustrated and described in detail in the drawings and foregoing description, such illustration and description are to be considered illustrative or exemplary and not restrictive. The disclosure is not limited to the disclosed embodiments. Variations to the disclosed embodiments can be understood and effected by those skilled in the art in practicing the claimed disclosure, from a study of the drawings, the disclosure and the appended claims.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,'

'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity. The indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. Any reference signs in the claims should not be construed as limiting the scope.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities of ingredients, reaction conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:
1. A tunnel field-effect transistor device, comprising:
   a semiconductor substrate;
   a fin structure contacting the semiconductor substrate on a major surface of the semiconductor substrate, wherein the fin structure is an elevated structure with respect to the semiconductor substrate, wherein the fin structure has a height measured in a direction orthogonal to the major surface of the semiconductor substrate, wherein the fin structure has a length measured in a longitudinal direction parallel to the major surface, wherein the fin structure has a width measured in a direction orthogonal to both the direction of the height and the longitudinal direction, the fin structure comprising a channel region, a drain region, and a source region, wherein the source region is disposed on the channel region, wherein the source region comprises a gate interface portion wherein the channel region is disposed on the drain region, and wherein the source region and the drain region are of opposite conductivity type;
   a pocket layer covering the gate interface portion of the source region, the pocket layer contacting at least part of the channel region, wherein the gate interface portion of the source region comprises at least three mutually non-coplanar surface segments;

a gate dielectric layer covering the pocket layer, the gate dielectric layer electrically isolating the gate electrode and the source region: and a gate electrode covering the gate dielectric layer, wherein the gate electrode is substantially parallel to the at least three non-coplanar surface segments, wherein the pocket layer comprises an intrinsic semiconductor material or is doped with a species opposite a conductivity type of the source region, wherein the pocket layer is configured to capture charge carriers tunneling from the source region in a direction of the gate electrode, and wherein the pocket layer is configured to divert the charge carriers via the channel region to a portion of the drain region which is in contact with the channel region but which is electrically insulated from the source region.

2. The tunnel field-effect transistor device of claim 1, wherein each of the at least three mutually non-coplanar surface segments are oriented orthogonal or parallel to the major surface of the semiconductor substrate contacting the fin structure.

3. The tunnel field-effect transistor device of claim 1, wherein the gate interface portion comprises an end portion of the source region with respect to a longitudinal direction along which the fin structure extends over the semiconductor substrate.

4. The tunnel field-effect transistor device of claim 3, further comprising a source contact configured for providing an electrical interface to the source region, a drain contact configured for providing an electrical interface to the drain region and a gate contact configured for providing an electrical interface to the gate electrode, wherein the source contact is disposed between the drain contact and the gate contact along the longitudinal direction.

5. The tunnel field-effect transistor device of claim 3, further comprising a source contact for providing an electrical interface to the source region, wherein the source contact is at least partially surrounded by the gate electrode.

6. The tunnel field-effect transistor device of claim 1, wherein the gate interface portion comprises a central portion of the source region with respect to a longitudinal direction along which the fin structure extends over the semiconductor substrate, and wherein the gate interface portion does not comprise an end portion of the source region with respect to the longitudinal direction.

7. The tunnel field-effect transistor device of claim 6, further comprising a source contact configured for providing an electrical interface to the source region, a drain contact configured for providing an electrical interface to the drain region and a gate contact configured for providing an electrical interface to the gate electrode, wherein the gate contact is disposed between the source contact and the drain contact along the longitudinal direction.

8. The tunnel field-effect transistor device of claim 1, wherein the gate interface portion comprises an end portion of the source region with respect to a longitudinal direction along which the fin structure extends over the semiconductor substrate.

9. The tunnel field-effect transistor device of claim 8, further comprising a source contact configured for providing an electrical interface to the source region, a drain contact configured for providing an electrical interface to the drain region and a gate contact configured for providing an electrical interface to the gate electrode, wherein the source contact is disposed between the drain contact and the gate contact along the longitudinal direction.

10. The tunnel field-effect transistor device of claim 8, further comprising a source contact for providing an electrical interface to the source region, wherein the source contact is at least partially surrounded by the gate electrode.

11. The tunnel field-effect transistor device of claim 1, wherein the gate interface portion comprises a central portion of the source region with respect to a longitudinal direction along which the fin structure extends over the semiconductor substrate, and wherein the gate interface portion does not comprise an end portion of the source region with respect to the longitudinal direction.

12. The tunnel field-effect transistor device of claim 11, further comprising a source contact configured for providing an electrical interface to the source region, a drain contact configured for providing an electrical interface to the drain region and a gate contact configured for providing an electrical interface to the gate electrode, wherein the gate contact is disposed between the source contact and the drain contact along the longitudinal direction.

13. The tunnel field-effect transistor device of claim 1, configured to avoid or reduce traverse tunneling or point tunneling.

14. The tunnel field-effect transistor device of claim 1, wherein the gate interface portion of the source region comprises four mutually non-coplanar surface segments, and wherein a gate is deposited on one side of the fin structure, whereby area tunneling can be achieved via the four mutually non-coplanar surface segments.

15. The tunnel field-effect transistor device of claim 1, further comprising a source contact configured for providing an electrical interface to the source region, a drain contact configured for providing an electrical interface to the drain region, and a gate contact configured for providing an electrical interface to the gate electrode, wherein the gate interface portion of the source region comprises four mutually non-coplanar surface segments, and wherein the source contact is disposed between the drain contact and the gate contact along the longitudinal direction parallel to the major surface, whereby tunneling can occur via the four mutually non-coplanar surface segments.

16. The tunnel field-effect transistor device of claim 15, further comprising spacers provided along a gate and source-channel region side wall, wherein the spacers are configured to allow silicidation to be carried out simultaneously for the gate contact, the source contact, and the drain contact, and wherein the spacers comprise a SiN material.

17. The tunnel field-effect transistor device of claim 1, wherein the pocket is doped so as to achieve a tuning of a tunneling onset voltage.

18. The tunnel field-effect transistor device of claim 1, wherein the source region comprises a source semiconductor material with a doping level of $10^{18}$ cm$^{-3}$ or higher, wherein the channel region comprises a semiconductor material that is undoped or doped at a doping level below $10^{17}$ cm$^{-3}$, and wherein the drain region comprises a drain semiconductor material with a doping level of $10^{18}$ cm$^{-3}$ or higher.

* * * * *